(12) United States Patent
Yasuda et al.

(10) Patent No.: US 8,040,488 B2
(45) Date of Patent: *Oct. 18, 2011

(54) SUBSTRATE PROCESSING APPARATUS

(75) Inventors: Shuichi Yasuda, Kyoto (JP); Masashi Kanaoka, Kyoto (JP); Koji Kaneyama, Kyoto (JP); Tadashi Miyagi, Kyoto (JP); Kazuhito Shigemori, Kyoto (JP); Toru Asano, Kyoto (JP); Yukio Toriyama, Kyoto (JP); Takashi Taguchi, Kyoto (JP); Tsuyoshi Mitsuhashi, Kyoto (JP); Tsuyoshi Okumura, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 971 days.

This patent is subject to a terminal disclaimer.

(21) Appl. No.: 11/294,727

(22) Filed: Dec. 6, 2005

(65) Prior Publication Data

US 2006/0152693 A1 Jul. 13, 2006

(30) Foreign Application Priority Data

Dec. 6, 2004 (JP) .................................. 2004-353118
Mar. 29, 2005 (JP) .................................. 2005-095781
Sep. 14, 2005 (JP) .................................. 2005-267329

(51) Int. Cl.
*G03B 27/32* (2006.01)
*G03B 27/52* (2006.01)
*G03D 5/00* (2006.01)

(52) U.S. Cl. ............................ 355/27; 396/611; 355/30

(58) Field of Classification Search .................... 355/27, 355/53, 30; 369/611; 396/611; 438/908
See application file for complete search history.

(56) References Cited

U.S. PATENT DOCUMENTS

| | | | | |
|---|---|---|---|---|
| 5,664,254 A | * | 9/1997 | Ohkura et al. | 396/612 |
| 5,997,653 A | * | 12/1999 | Yamasaka | 134/2 |
| 6,051,101 A | * | 4/2000 | Ohtani et al. | 156/345.32 |
| 6,097,469 A | * | 8/2000 | Yaegashi et al. | 355/30 |
| 6,341,903 B1 | * | 1/2002 | Ueda | 396/611 |
| 6,454,472 B1 | | 9/2002 | Kim et al. | |
| 6,558,053 B2 | * | 5/2003 | Shigemori et al. | 396/611 |
| 6,893,171 B2 | * | 5/2005 | Fukutomi et al. | 396/611 |
| 2001/0014224 A1 | * | 8/2001 | Hasebe et al. | 396/579 |
| 2002/0035762 A1 | * | 3/2002 | Okuda et al. | 15/77 |

(Continued)

FOREIGN PATENT DOCUMENTS

CN 1455438 11/2003

(Continued)

OTHER PUBLICATIONS

English translation of PCT/JP2003/015587 filed Dec. 5, 2003.*

(Continued)

*Primary Examiner* — Hung Henry Nguyen
*Assistant Examiner* — Steven H Whitesell Gordon
(74) *Attorney, Agent, or Firm* — Kilpatrick Townsend & Stockton LLP

(57) ABSTRACT

A substrate processing apparatus comprises an indexer block, an anti-reflection film processing block, a resist film processing block, a development processing block, a processing block for liquid immersion exposure processing, and an interface block. An exposure device is arranged adjacent to the interface block. The processing block for liquid immersion exposure processing comprises a coating processing group for resist cover film and a removal processing group for resist cover film. The resist cover film is formed in the processing block for liquid immersion exposure processing before the exposure processing. The resist cover film is removed in the processing block for liquid immersion exposure processing after the exposure processing.

12 Claims, 17 Drawing Sheets

U.S. PATENT DOCUMENTS

| | | | |
|---|---|---|---|
| 2002/0092368 A1* | 7/2002 | Nishimura et al. | 73/865.8 |
| 2002/0098458 A1* | 7/2002 | Hashimoto | 432/247 |
| 2003/0034458 A1* | 2/2003 | Isoda et al. | 250/484.4 |
| 2003/0045131 A1* | 3/2003 | Verbeke et al. | 438/795 |
| 2004/0005149 A1 | 1/2004 | Sugimoto et al. | |
| 2004/0182318 A1* | 9/2004 | Hashinoki et al. | 118/719 |
| 2005/0046934 A1* | 3/2005 | Ho et al. | 359/380 |
| 2005/0069819 A1* | 3/2005 | Shiobara | 430/327 |
| 2005/0176254 A1* | 8/2005 | Takeishi et al. | 438/694 |
| 2005/0287821 A1 | 12/2005 | Higashi et al. | |
| 2006/0008747 A1* | 1/2006 | Kawamura et al. | 430/322 |
| 2006/0061747 A1 | 3/2006 | Ishii | |
| 2006/0098979 A1* | 5/2006 | Kaneyama et al. | 396/611 |
| 2006/0104635 A1 | 5/2006 | Kaneyama et al. | |
| 2006/0105924 A1 | 5/2006 | Yuki et al. | |
| 2006/0134330 A1* | 6/2006 | Ishikawa et al. | 427/248.1 |
| 2006/0141400 A1 | 6/2006 | Hirayama et al. | |
| 2006/0147202 A1* | 7/2006 | Yasuda et al. | 396/611 |
| 2006/0152694 A1* | 7/2006 | Yasuda et al. | 355/27 |
| 2006/0152698 A1 | 7/2006 | Ishii | |
| 2007/0122551 A1* | 5/2007 | Yamamoto et al. | 427/240 |
| 2007/0134593 A1 | 6/2007 | Hirayama et al. | |
| 2007/0177869 A1* | 8/2007 | Yamamoto et al. | 396/611 |
| 2008/0020315 A1 | 1/2008 | Higashi et al. | |

FOREIGN PATENT DOCUMENTS

| | | |
|---|---|---|
| JP | 06-151293 A | 5/1994 |
| JP | 08-314156 A | 11/1996 |
| JP | 10-041261 A | 2/1998 |
| JP | 2002-217267 A | 8/2002 |
| JP | 2002-273360 A | 9/2002 |
| JP | 3337677 B2 | 10/2002 |
| JP | 2003-092283 A | 3/2003 |
| JP | 2003-324139 | 11/2003 |
| JP | 2004-015023 A | 1/2004 |
| JP | 2004-087795 A | 3/2004 |
| JP | 2004-193597 A | 7/2004 |
| JP | 2004-319767 A | 11/2004 |
| JP | 2005-109146 A | 4/2005 |
| JP | 2005-197469 | 7/2005 |
| JP | 2005-294520 | 10/2005 |
| JP | 2006-024684 A | 1/2006 |
| WO | WO99/49504 | 9/1999 |
| WO | WO 2004053952 A1 * | 6/2004 |
| WO | WO 2004/074937 A1 | 9/2004 |
| WO | WO 2004/079800 | 9/2004 |
| WO | WO 2004/102646 A1 | 11/2004 |

OTHER PUBLICATIONS

Conley et al. "Understanding the Photoresist Surface-Liquid interface for ArF Immersion lithography" presented 2004 Sematech Immersion & 157nm Symposium on Aug. 4, 2004.*
Office Action of Chinese Application 200510129565.0 dated Oct. 12, 2007 [English Translation].
Office Action of U.S. Appl. No. 11/273,439, mailed Sep. 23, 2008, 11 pages total.
Office Action in the counterpart Japanese Application No. 2005-267329, dated Mar. 1, 2011, 4 pages.
Office Action in the counterpart Japanese Application No. 2005-267329 dated May 31, 2011, 3 pages.

* cited by examiner

F I G. 8
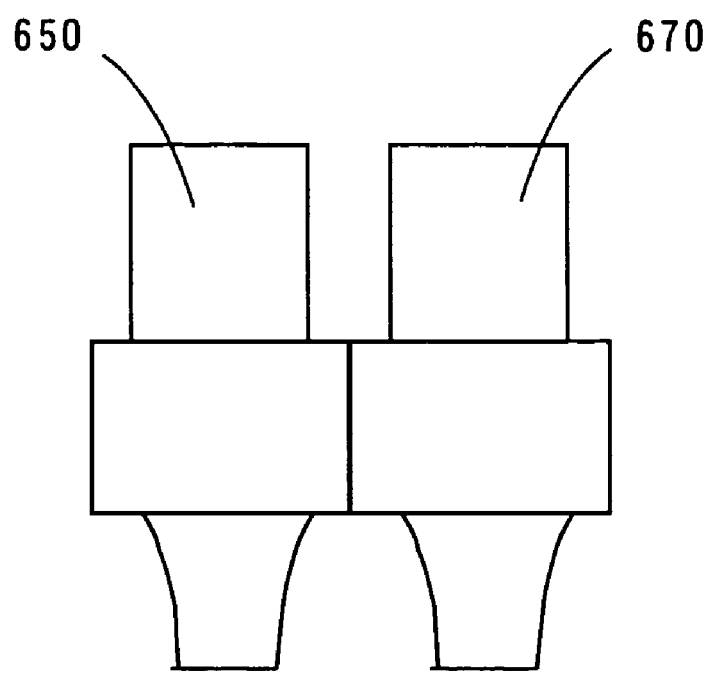

F I G. 9
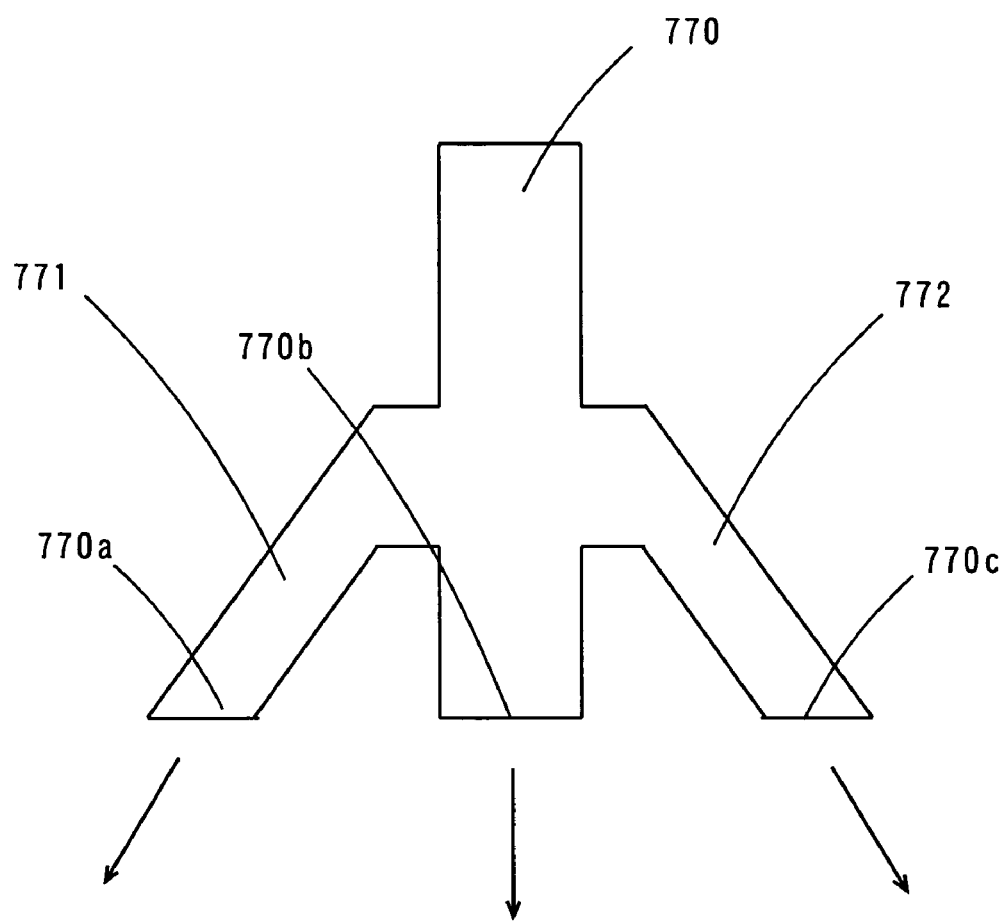

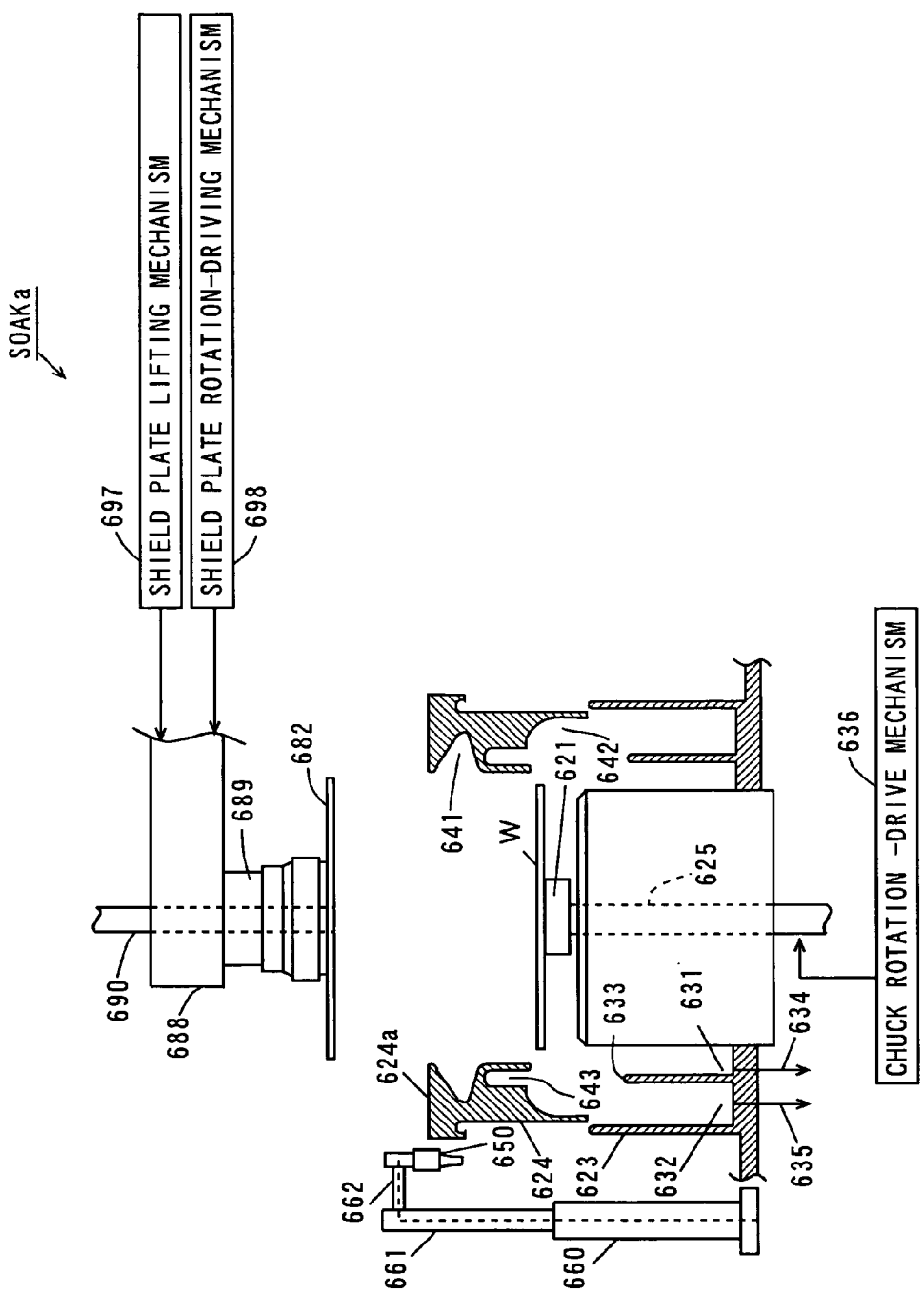
F I G. 12

F I G. 1 7
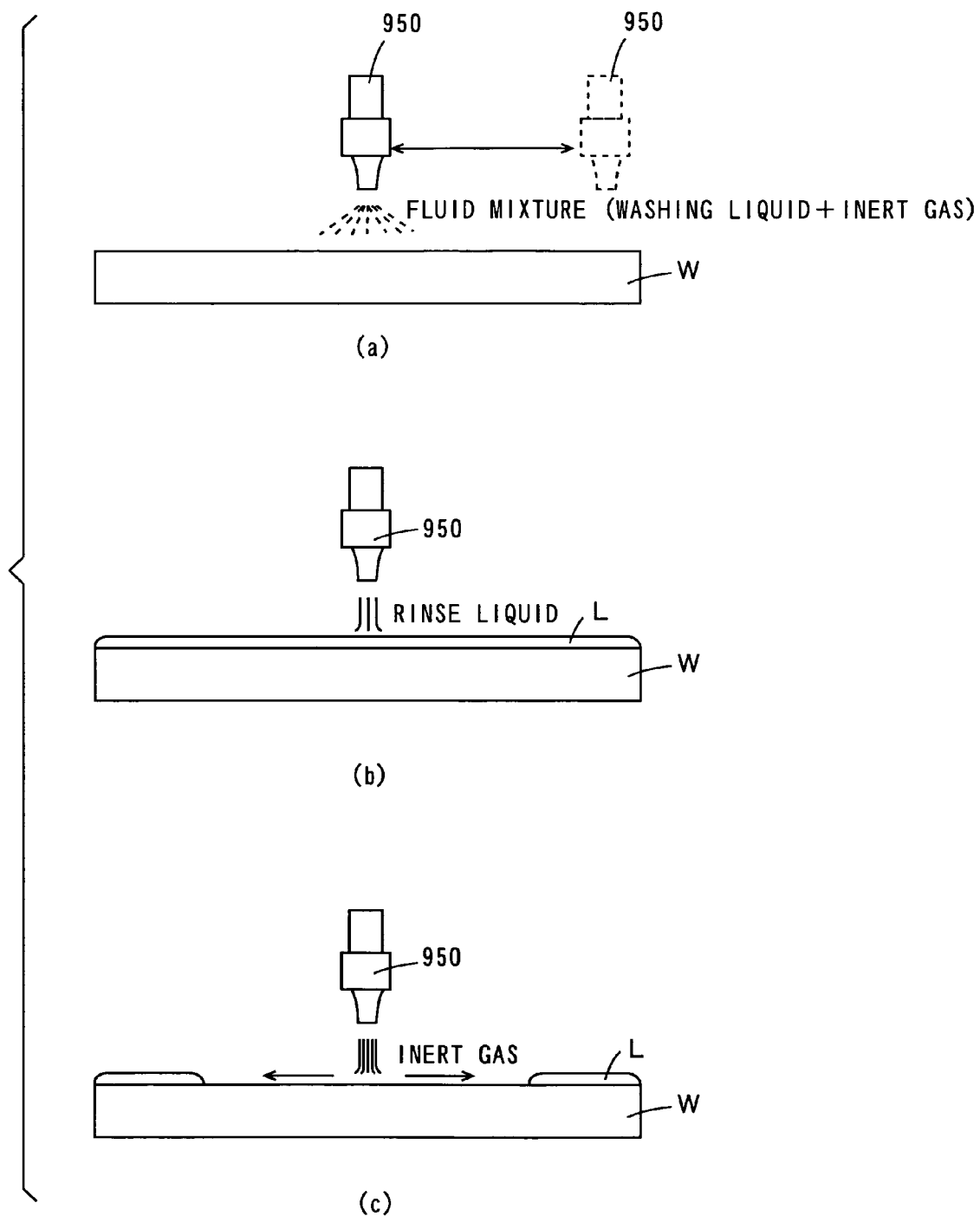

SUBSTRATE PROCESSING APPARATUS

CROSS REFERENCE TO A RELATED APPLICATION

The present application is related to the following four applications filed Dec. 6, 2005, and commonly owned: 1) SUBSTRATE PROCESSING APPARATUS AND SUBSTRATE PROCESSING METHOD, Ser. No. 11/294,877; 2) SUBSTRATE PROCESSING APPARATUS, Ser. No. 11/295,257; 3) SUBSTRATE PROCESSING APPARATUS AND SUBSTRATE PROCESSING METHOD, Ser. No. 11/295,240; 4) SUBSTRATE PROCESSING APPARATUS, Ser. No. 11/295,216.

BACKGROUND OF THE INVENTION

1. Field of the Invention

The present invention relates to substrate processing apparatuses for applying processing to substrates.

2. Description of the Background Art

A substrate processing apparatus is used to apply a variety of processing to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processing to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then carried to the exposure device through the interface block. After the exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, part of the component of a resist applied on the substrate is eluted in the liquid. The resist components eluted in the liquid remain on a surface of the substrate, which may become the cause of a defect.

The resist components eluted in the liquid contaminate the lens of the exposure device. This may cause a defective dimension and a defective shape of the exposure pattern.

SUMMARY OF THE INVENTION

It is an object of the present invention to provide a substrate processing apparatus in which processing defects of a substrate that may be generated during the exposure processing in an exposure device can prevented at low cost.

(1)

A substrate processing apparatus according to one aspect of the present invention that is arranged adjacent to an exposure device comprises a processing section for applying processing to a substrate, and an interface arranged adjacent to one end of a processing section for exchanging the substrate between the processing section and the exposure device, wherein the processing section comprises a first processing block that includes a first processing unit that forms a photosensitive film made of a photosensitive material on the substrate, a first thermal processing unit that thermally treats the substrate, and a first transport unit that transports the substrate; a second processing block that includes a second processing unit that applies development processing to the substrate after the exposure processing by the exposure device, a second thermal processing unit that thermally treats the substrate, and a second transport unit that transports the substrate; a third processing block that includes a third processing unit that performs processing for preventing degradation of the photosensitive film on the substrate in the exposure device before the exposure processing by the exposure device, a fourth processing unit that performs processing for making the substrate an optimal condition after the exposure processing by the exposure device and before the development processing by the second processing unit, a third thermal processing unit that thermally treats the substrate, and a third transport unit that transports the substrate, and wherein the third processing block is arranged adjacent to the interface.

In the substrate processing apparatus, a photosensitive film made of a photosensitive material is formed on the substrate by the first processing unit in the first processing block. Then, the substrate is transported to the first thermal processing unit by the first transport unit, and subjected to given thermal treatment by the first thermal processing unit. The substrate is subsequently transported to an adjacent other processing block by the first transport unit.

Next, in the third processing block, the third processing unit performs processing for preventing degradation of the photosensitive film on the substrate in the exposure device. Then, the substrate is transferred to the exposure device from the third processing block through the interface, where the substrate is subjected to the exposure processing. The substrate after the exposure processing is transported to the third processing block from the exposure device through the interface.

Next, in the third processing block, the substrate is subjected to a post-exposure bake (PEB) by the third thermal processing unit. Then, the substrate is transported to the fourth processing unit by the third transport unit, and subjected to the processing for making the substrate after the exposure processing an optimal condition by the fourth processing unit. The substrate is subsequently transported to an adjacent other processing block by the third transport unit.

Next, in the second processing block, the substrate is subjected to the development processing by the second processing unit. The substrate is subsequently transported to the second thermal processing unit by the second transport unit, and subjected to given thermal treatment by the second thermal processing unit. Then, the substrate is transported to an adjacent other processing block by the second transport unit.

In this way, the third processing unit performs the processing for preventing degradation of a photosensitive film on the substrate in the exposure device before the exposure processing. This prevents contamination in the exposure device with the photosensitive material. As a result, processing defects of the substrate that may be generated during the exposure processing can be reduced.

In addition, the fourth processing unit performs the processing for making the substrate an optimal condition after the exposure processing and before the development processing. This reduces processing defects of the substrate that may be generated in the process after the exposure processing.

Moreover, the third processing block is arranged adjacent to the interface. Thus, given processing can be applied to the substrate by the third processing unit immediately before the exposure processing, and given processing can be applied to the substrate by the fourth processing unit immediately after the exposure processing. This sufficiently reduces processing defects of the substrate that may be generated during the exposure processing and after the exposure processing.

Furthermore, since the substrate processing apparatus has the structure in which the third processing block is added to an existing substrate processing apparatus having the first and second processing blocks, processing defects that may be generated during the exposure processing and after the exposure processing can be reduced at low cost.

(2)

The third processing unit may form a protective film for protecting the photosensitive film.

In this case, even if the substrate in contact with a liquid is subjected to the exposure processing by the exposure device, it is possible to prevent the component of the photosensitive material from being eluted in the liquid. This reduces contamination in the exposure device while preventing the component of the photosensitive material from remaining on a surface of the substrate. As a result, processing defects of the substrate that may be generated during the exposure processing in the exposure device are sufficiently reduced.

(3)

The fourth processing unit may remove a protective film. In this case, development processing is reliably performed so that the processing defects of the substrate during the development processing after the exposure processing are sufficiently reduced.

(4)

The interface may include a fifth processing unit that applies given processing to the substrate, the platform on which the substrate is temporarily mounted, the fourth transport unit that transports the substrate between the processing section, the fifth processing unit and the platform, and the fifth transport unit that transports the substrate between the platform and the exposure device.

In this case, the substrate is subjected to the given processing by the processing section, and then transported to the fifth processing unit from the processing section by the fourth transport unit. After the substrate is subjected to the given processing by the fifth processing unit, the substrate is transported to the platform by the fourth transport unit. Then, the substrate is transported to the exposure device from the platform by the fifth transport unit. After the substrate is subjected to the exposure processing by the exposure device, the substrate is transported to the platform from the exposure device by the fifth transport unit. Then, the substrate is subsequently transported to the processing section from the platform by the fourth transport unit.

In this way, the disposition of the fifth processing unit in the interface and the transport of the substrate by the two transport units enables the addition of processing contents without increasing the footprint of the substrate processing apparatus.

(5)

The fourth transport unit may include first and second holders for holding the substrate, the fourth transport unit may hold the substrate with the first holder during the transport of the substrate before the exposure processing by the exposure device, and may hold the substrate with the second holder during the transport of the substrate after the exposure processing by the exposure device, the fifth transport unit may include third and fourth holders for holding the substrate, and the fifth transport unit may hold the substrate with the third holder during the transport of the substrate before the exposure processing by the exposure device, and may hold the substrate with the fourth holder during the transport of the substrate after the exposure processing by the exposure device.

In this case, the first and third holders are used during the transport of the substrate to which no liquid is attached before the exposure processing, while the second and fourth holders are used during the transport of the substrate to which a liquid is attached after the exposure processing. This prevents a liquid from attaching to the first and third holders, which prevents the attachment of a liquid to the substrate before the exposure processing. This prevents the attachment of particles and the like in the atmosphere to the substrate before the exposure processing, which prevents contamination of the substrate before the exposure processing. As a result, it is possible to prevent contamination in the exposure device while reducing processing defects of the substrate that may be generated during the exposure processing in the exposure device.

(6)

The second holder may be provided below the first holder, and the fourth holder may be provided below the third holder. In this case, even if a liquid drops from the second and fourth holders and the substrate held thereon, the liquid will not attach to the first and third holders and the substrate held thereon. The liquid is thus reliably prevented from attaching to the substrate before the exposure processing.

(7)

The fourth processing unit may dry the substrate. In this case, even if a liquid attached to the substrate in the exposure device, it is possible to prevent the liquid from dropping in the substrate processing apparatus. As a result, in the substrate processing apparatus, operational troubles such as abnormalities in the electric system are prevented. Moreover, by drying the substrate, it is possible to prevent the attachment of particles and the like in the atmosphere to the substrate, which prevents contamination of the substrate. This sufficiently reduces processing defects of the substrate that may be generated in the process after the exposure processing.

(8)

The fourth processing unit may further wash the substrate before drying the substrate.

In this case, even if a liquid attaches to the substrate during exposure, and particles and the like in the atmosphere attach to the substrate while being transported from the exposure device to the fourth processing unit, the deposits can be removed reliably. This reliably prevents processing defects of the substrate.

(9)

The fourth processing unit may comprise a substrate holding device that holds the substrate substantially horizontally, a rotation-driving device that rotates the substrate held on the substrate holding device about an axis vertical to the substrate, a washing liquid supplier that supplies a washing liquid onto the substrate held on the substrate holding device, and an inert gas supplier that supplies an inert gas onto the substrate after the washing liquid has been supplied onto the substrate by the washing liquid supplier.

In the fourth processing unit, the substrate is held on the substrate holding device substantially horizontally, and the substrate is rotated about the axis vertical to the substrate by the rotation-driving device. Then, the washing liquid is supplied onto the substrate from the washing liquid supplier, followed by the supply of the inert gas from the inert gas supplier.

In this case, since the substrate is rotated as the washing liquid is supplied onto the substrate, the washing liquid on the substrate moves toward the peripheral portion of the substrate by the centrifugal force and splashed away. This reliably prevents the deposits of particles and the like removed by the washing liquid from remaining on the substrate. In addition, since the substrate is rotated as the inert gas is supplied onto the substrate, the washing liquid remaining on the substrate after the washing of the substrate is efficiently removed. This reliably prevents the deposits of particles and the like from remaining on the substrate and the substrate dried reliably. During the transport of the substrate after the drying processing to the second processing unit, therefore, it is possible to reliably prevent the components of the photosensitive material on the substrate from being eluted in the washing liquid remaining on the substrate. This reliably prevents the deformation of the exposure pattern formed on the photosensitive film. As a result, processing defects of the substrate are reliably prevented during the development processing in the second processing unit.

(10)

The inert gas supplier may supply the inert gas so that the washing liquid supplied onto the substrate from the washing liquid supplier is removed from the substrate as the washing liquid moves outwardly from the center of the substrate.

This prevents the washing liquid from remaining on the center of the substrate, thus reliably preventing the generation of dry marks (dry stains) on a surface of the substrate. Moreover, during the transport of the substrate after the drying processing to the second processing unit, it is possible to reliably prevent the components of the photosensitive material from being eluted in the washing liquid remaining on the substrate. This reliably prevents the deformation of the exposure pattern formed on the photosensitive film. As a result, processing defects of the substrate are reliably prevented during the development processing in the second processing unit.

(11)

The fourth processing unit may further comprise a rinse liquid supplier that supplies a rinse liquid onto the substrate after the supply of the washing liquid from the washing liquid supplier and before the supply of the inert gas from the inert gas supplier.

This allows the washing liquid to be reliably washed away by the rinse liquid, thus reliably preventing the deposits of particles and the like from remaining on the substrate.

(12)

The inert gas supplier may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Moreover, during the transport of the substrate after the drying processing to the second processing unit, it is possible to reliably prevent the components of the photosensitive material from being eluted in the washing liquid remaining on the substrate. This prevents the deformation of the exposure pattern formed on the photosensitive film more reliably.

(13)

The fourth processing unit may apply washing processing to the substrate by supplying a fluid mixture containing an inert gas and a washing liquid onto the substrate from the fluid nozzle.

Since the fluid mixture discharged from the fluid nozzle contains fine droplets in the washing liquid, any contaminants attached on the surface of the substrate are stripped off, even if the surface has irregularities. Moreover, even if the film on the substrate surface has low wettability, the fine droplets strip off the contaminants on the substrate surface, so that the contaminants can be reliably removed from the substrate surface. As a result of the foregoing, processing defects of the substrate due to the contamination of the substrate after the exposure processing are prevented.

In addition, adjusting the flow rate of the gas allows adjustments to be easily made to the detergency in washing the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate and wash the substrate reliably.

(14)

The gas may be an inert gas. In this case, it is possible to prevent a chemical influence upon the film on the substrate and the washing liquid while removing the contaminants on the substrate surface more reliably, even if a chemical solution is used as washing liquid. As a result, processing defects of the substrate due to the contamination of the substrate after the exposure processing are prevented.

(15)

The fourth processing unit may include an inert gas supplier that dries the substrate by supplying an inert gas onto the substrate. In this case, the use of the inert gas prevents a chemical influence upon a film on the substrate and the substrate dried reliably.

(16)

The fluid nozzle may function as the inert gas supplier. In this case, the inert gas is supplied onto the substrate from the fluid nozzle to apply drying processing to the substrate. This obviates the need to provide the inert gas supplier separately from the fluid nozzle. As a result, the washing and drying processing can be reliably applied to the substrate with a simple structure.

(17)

The fourth processing unit may further include a substrate holding device that holds the substrate substantially horizontally, and a rotation-driving device that rotates the substrate held on the substrate holding device about an axis vertical to the substrate.

In the fourth processing unit, the substrate is held on the substrate holding device substantially horizontally, and the substrate is rotated about the axis vertical to the substrate by the rotation-driving device. Further, the fluid mixture is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the washing of the substrate is efficiently removed. This reliably prevents the deposits of particles and the like from remaining on the substrate and the substrate dried reliably. As a result, processing defects of the substrate are prevented reliably.

(18)

The fourth processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, processing defects of the substrate are prevented reliably.

(19)

The fourth processing unit may further include a rinse liquid supplier that supplies a rinse liquid onto the substrate, after the supply of the fluid mixture from the fluid nozzle and before the supply of the inert gas from the inert gas supplier.

This allows the fluid mixture to be reliably washed away by the rinse liquid, thus reliably preventing the deposits of particles and the like from remaining on the substrate.

(20)

The fluid nozzle may function as the rinse liquid supplier. In this case, the rinse liquid is supplied from the fluid nozzle. This obviates the need to provide the rinse liquid supplier separately from the fluid nozzle. As a result, the washing and drying processing can be reliably applied to the substrate with a simple structure.

(21)

The fourth processing unit may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, processing defects of the substrate are prevented reliably.

(22)

The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and has an opening that communicates with the gas flow passage.

In this case, the washing liquid flows through the liquid flow passage, and is discharged from the liquid discharge port, while the gas flows through the gas flow passage, and is discharged from the gas discharge port. The washing liquid and gas are mixed outside the fluid nozzle. A mist-like fluid mixture is thus generated.

In this way, the fluid mixture is generated by mixing the washing liquid and the gas outside the fluid nozzle. This obviates the need to provide space for mixing the washing liquid and the gas inside the fluid nozzle. As a result, the size of the fluid nozzle can be reduced.

(23)

The third processing unit may wash the substrate. In this case, part of the component of the photosensitive material on the substrate is eluted by washing processing, and washed away. Therefore, even if the substrate in contact with a liquid is subjected to the exposure processing by the exposure device, the component of the photosensitive material on the substrate is hardly eluted. This prevents contamination in the exposure device while preventing the component of the photosensitive material from remaining on a surface of the substrate. As a result, processing defects of the substrate that may be generated during the exposure processing in the exposure device can be reduced.

(24)

The third processing unit may further dry the substrate after washing the substrate.

This prevents the attachment of particles and the like in the atmosphere to the washed substrate. Also, if the washing liquid remains on the washed substrate, the component of the photosensitive material may be eluted in the residual washing liquid. Thus, by drying the washed substrate, it is possible to prevent the component of the photosensitive material from being eluted in the washing liquid remaining on the substrate. It is therefore possible to reliably prevent a defective shape of the photosensitive film formed on the substrate and the contamination inside the exposure device. As a result of the foregoing, processing defects of the substrate are reliably prevented.

(25)

The third processing unit may comprise a substrate holding device that holds the substrate substantially horizontally, a rotation-driving device that rotates the substrate held on the substrate holding device about an axis vertical to the substrate, a washing liquid supplier that supplies a washing liquid onto the substrate held on the substrate holding device, and an inert gas supplier that supplies an inert gas onto the substrate after the washing liquid has been supplied onto the substrate by the washing liquid supplier.

In the third processing unit, the substrate is held on the substrate holding device substantially horizontally, and the substrate is rotated about the axis vertical to the substrate by the rotation-driving device. Further, the washing liquid is supplied onto the substrate from the washing liquid supplier, followed by the supply of the inert gas from the inert gas supplier.

In this case, since the substrate is rotated as the washing liquid is supplied onto the substrate, the washing liquid on the substrate moves toward the peripheral portion of the substrate by the centrifugal force and splashed away. This prevents the component of the photosensitive material eluted in the washing liquid from remaining on the substrate. In addition, since the substrate is rotated as the inert gas is supplied onto the substrate, the washing liquid remaining on the substrate after the washing of the substrate is efficiently removed. This reliably prevents the component of the photosensitive material from remaining on the substrate and the substrate dried reliably. During the transport of the washed substrate to the exposure device, therefore, it is possible to reliably prevent the components of the photosensitive material on the substrate from being further eluted in the washing liquid remaining on the substrate. As a result of the foregoing, it is possible to reliably prevent a defective shape of the photosensitive film formed on the substrate and the contamination inside the exposure device.

(26)

The inert gas supplier may supply the inert gas so that the washing liquid supplied onto the substrate from the washing liquid supplier is removed from the substrate as the washing liquid moves outwardly from the center of the substrate.

This prevents the washing liquid from remaining on the center of the substrate, which reliably prevents the generation of dry marks (dry stains) on the surface of the substrate. Also, during the transport of the washed substrate to the exposure device, it is possible to prevent the component of the photosensitive material on the substrate from being further eluted in the washing liquid remaining on the substrate. It is thus possible to prevent processing defects of the substrate more reliably.

(27)

The third processing unit may further comprise a rinse liquid supplier that supplies a rinse liquid onto the substrate after the supply of the washing liquid from the washing liquid supplier and before the supply of the inert gas from the inert gas supplier.

This allows the washing liquid to be reliably washed away by the rinse liquid, making it possible to prevent the component of the photosensitive material eluted in the washing liquid from remaining on the substrate more reliably.

(28)

The inert gas supplier may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, which reliably prevents the generation of dry marks (dry stains) on the surface of the substrate. Also, during the transport of the washed substrate to the exposure device, it is possible to prevent the component of the photosensitive material on the substrate from being further eluted in the rinse liquid remaining on the substrate. It is thus possible to prevent processing defects of the substrate more reliably.

(29)

The third processing unit may wash the substrate by supplying a fluid mixture containing a washing liquid and a gas onto the substrate from a fluid nozzle.

Since the fluid mixture discharged from the fluid nozzle contains fine droplets in the washing liquid, any contaminants attached on the surface of the substrate are stripped off, even if the surface has irregularities. Moreover, even if the film on the substrate surface has low wettability, the fine droplets strip off the contaminants on the substrate surface, so that the contaminants can be reliably removed from the substrate surface.

Consequently, even if the solvent or the like in the film on the substrate is sublimated and the sublimates are attached to the substrate again before the exposure processing, the sublimates attached to the substrate can be reliably removed by the third processing unit. It is therefore possible to reliably prevent the contamination inside the exposure device. As a result of the foregoing, processing defects of the substrate can be reliably reduced.

In addition, adjusting the flow rate of the gas allows adjustments to be easily made to the detergency in washing the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate and wash the substrate reliably.

(30)

The gas may be an inert gas. In this case, it is possible to prevent a chemical influence upon the film on the substrate and the washing liquid while removing the contaminants on the substrate surface more reliably, even if a chemical solution is used as washing liquid.

(31)

The third processing unit may further dry the substrate after washing the substrate.

This prevents the attachment of particles and the like in the atmosphere to the washed substrate. Also, if the washing liquid remains on the washed substrate, the component of the film formed on the substrate may be eluted in the residual washing liquid. Thus, by drying the washed substrate, it is possible to prevent the component of the film on the substrate from being eluted in the washing liquid remaining on the substrate. It is therefore possible to reliably prevent a defective shape of the photosensitive film formed on the substrate and the contamination inside the exposure device. As a result of the foregoing, processing defects of the substrate are reliably prevented.

(32)

The third processing unit may include an inert gas supplier that dries the substrate by supplying an inert gas onto the substrate. In this case, the use of the inert gas prevents a chemical influence upon a film on the substrate and the substrate dried reliably.

(33)

The fluid nozzle may function as the inert gas supplier. In this case, the inert gas is supplied onto the substrate from the fluid nozzle to apply drying processing to the substrate. This obviates the need to provide the inert gas supplier separately from the fluid nozzle. As a result, the washing and drying processing can be reliably applied to the substrate with a simple structure.

(34)

The third processing unit may further include a substrate holding device that holds the substrate substantially horizontally, and a rotation-driving device that rotates the substrate held on the substrate holding device about an axis vertical to the substrate.

In the third processing unit, the substrate is held on the substrate holding device substantially horizontally, and the substrate is rotated about the axis vertical to the substrate by the rotation-driving device. Further, the fluid mixture is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the washing of the substrate is efficiently removed. This reliably prevents the deposits of particles and the like from remaining on the substrate and the substrate dried reliably. As a result, processing defects of the substrate are prevented reliably.

(35)

The third processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, processing defects of the substrate are prevented reliably.

(36)

The third processing unit may further include a rinse liquid supplier that supplies a rinse liquid onto the substrate, after the supply of the fluid mixture from the fluid nozzle and before the supply of the inert gas from the inert gas supplier.

This allows the fluid mixture to be reliably washed away by the rinse liquid, thus reliably preventing the deposits of particles and the like from remaining on the substrate.

(37)

The fluid nozzle may function as the rinse liquid supplier. In this case, the rinse liquid is supplied from the fluid nozzle. This obviates the need to provide the rinse liquid supplier separately from the fluid nozzle. As a result, the washing and drying processing can be reliably applied to the substrate with a simple structure.

(38)

The third processing unit supplies the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, processing defects of the substrate are prevented reliably.

(39)

The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and has an opening that communicates with the gas flow passage.

In this case, the washing liquid flows through the liquid flow passage, and is discharged from the liquid discharge port, while the gas flows through the gas flow passage, and is discharged from the gas discharge port. The washing liquid and gas are mixed outside the fluid nozzle. A mist-like fluid mixture is thus generated.

In this way, the fluid mixture is generated by mixing the washing liquid and the gas outside the fluid nozzle. This obviates the need to provide space for mixing the washing liquid and the gas inside the fluid nozzle. As a result, the size of the fluid nozzle can be reduced.

(40)

The third processing unit may form a protective film for protecting the photosensitive film.

In this case, even if the substrate in contact with a liquid is subjected to the exposure processing by the exposure device, it is possible to prevent the component of the photosensitive material from being eluted in the liquid. This reduces contamination in the exposure device while preventing the component of the photosensitive material from remaining on a surface of the substrate. As a result, processing defects of the substrate that may be generated during the exposure processing in the exposure device can be sufficiently reduced.

(41)

The second processing block may further comprise a sixth processing unit that removes the protective film before the development processing by the second processing unit.

In this case, processing defects of the substrate that may be generated during the development processing can be reduced without increasing the footprint of the substrate processing apparatus.

(42)

The third processing block may further comprise a seventh processing unit that washes the substrate after the formation of the protective film by the third processing unit and before the exposure processing by the exposure device.

In this case, since the particles and the like attached to the substrate in the process before the exposure processing is removed immediately before the exposure processing, the contamination inside the exposure device is reliably prevented.

(43)

The seventh processing unit may further dry the substrate after washing the substrate.

This prevents the attachment of particles and the like in the atmosphere to the washed substrate. It is thus possible to prevent the contamination inside the exposure device reliably. As a result, processing defects of the substrate are reliably prevented.

(44)

The seventh processing unit may comprise a substrate holding device that holds the substrate substantially horizontally, a rotation-driving device that rotates the substrate held on the substrate holding device about an axis vertical to the substrate, a washing liquid supplier that supplies a washing liquid onto the substrate held on the substrate holding device, and an inert gas supplier that supplies an inert gas onto the substrate after the washing liquid has been supplied onto the substrate by the washing liquid supplier.

In the seventh processing unit, the substrate is held on the substrate holding device substantially horizontally, and the substrate is rotated about the axis vertical to the substrate by the rotation-driving device. Further, the washing liquid is supplied onto the substrate from the washing liquid supplier, followed by the supply of the inert gas from the inert gas supplier.

In this case, since the substrate is rotated as the washing liquid is supplied onto the substrate, the washing liquid on the substrate moves toward the peripheral portion of the substrate by the centrifugal force and splashed away. This reliably prevents the deposits of particles and the like removed by the washing liquid from remaining on the substrate. In addition, since the substrate is rotated as the inert gas is supplied onto the substrate, the washing liquid remaining on the substrate after the washing of the substrate is efficiently removed. This reliably prevents the deposits of particles and the like from remaining on the substrate and the substrate dried reliably. As a result, processing defects of the substrate are prevented reliably.

(45)

The inert gas supplier supplies the inert gas so that the washing liquid supplied onto the substrate from the washing liquid supplier is removed from the substrate as the washing liquid moves outwardly from the center of the substrate.

This prevents the washing liquid from remaining on the center of the substrate, thus reliably preventing the particles and the like in the atmosphere from being attached to the substrate. Accordingly, processing defects of the substrate are prevented reliably.

(46)

The seventh processing unit may further comprise a rinse liquid supplier that supplies a rinse liquid onto the substrate after the supply of the washing liquid from the washing liquid supplier and before the supply of the inert gas from the inert gas supplier.

This allows the washing liquid to be reliably washed away by the rinse liquid, thus reliably preventing the deposits of particles and the like from remaining on the substrate. Accordingly, processing defects of the substrate are prevented reliably.

(47)

The inert gas supplier may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the particles and the like in the atmosphere from being attached to the substrate. Accordingly, processing defects of the substrate are prevented reliably.

(48)

The seventh processing unit may wash the substrate by supplying a fluid mixture containing a washing liquid and a gas onto the substrate from a fluid nozzle.

Since the fluid mixture discharged from the fluid nozzle contains fine droplets in the washing liquid, any contaminants attached on the surface of the substrate are stripped off, even if the surface has irregularities. Moreover, even if the film on the substrate surface has low wettability, the fine droplets strip off the contaminants on the substrate surface, so that the contaminants can be reliably removed from the substrate surface.

Consequently, even if the solvent or the like in the film on the substrate is sublimated and the sublimates are attached to the substrate again before the exposure processing, the sublimates attached to the substrate can be reliably removed by the seventh processing unit. It is therefore possible to reliably prevent the contamination inside the exposure device. As a result of the foregoing, processing defects of the substrate can be reliably reduced.

In addition, adjusting the flow rate of the gas allows adjustments to be easily made to the detergency in washing the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate and wash the substrate reliably.

(49)

The gas may be an inert gas. In this case, it is possible to prevent a chemical influence upon the film on the substrate and the washing liquid while removing the contaminants on the substrate surface more reliably, even if a chemical solution is used as washing liquid.

(50)

The seventh processing unit may further dry the substrate after washing the substrate.

This prevents the attachment of particles and the like in the atmosphere to the washed substrate. Also, if the washing liquid remains on the washed substrate, the component of the film formed on the substrate may be eluted in the residual washing liquid. Thus, by drying the washed substrate, it is possible to prevent the component of the film on the substrate from being eluted in the washing liquid remaining on the substrate. It is therefore possible to reliably prevent a defective shape of the photosensitive film formed on the substrate and the contamination inside the exposure device. As a result of the foregoing, processing defects of the substrate are reliably prevented.

(51)

The seventh processing unit may include an inert gas supplier that dries the substrate by supplying an inert gas onto the substrate. In this case, the use of the inert gas prevents a chemical influence upon a film on the substrate and the substrate dried reliably.

(52)

The fluid nozzle may function as the inert gas supplier. In this case, the inert gas is supplied onto the substrate from the fluid nozzle to apply drying processing to the substrate. This obviates the need to provide the inert gas supplier separately from the fluid nozzle. As a result, the washing and drying processing can be reliably applied to the substrate with a simple structure.

(53)

The seventh processing unit may further include a substrate holding device that holds the substrate substantially horizontally, and a rotation-driving device that rotates the substrate held on the substrate holding device about an axis vertical to the substrate.

In the seventh processing unit, the substrate is held on the substrate holding device substantially horizontally, and the substrate is rotated about the axis vertical to the substrate by the rotation-driving device. Further, the fluid mixture is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the washing of the substrate is efficiently removed. This reliably prevents the deposits of particles and the like from remaining on the substrate and the substrate dried reliably. As a result, processing defects of the substrate are prevented reliably.

(54)

The seventh processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, processing defects of the substrate are prevented reliably.

(55)

The seventh processing unit may further include a rinse liquid supplier that supplies a rinse liquid onto the substrate, after the supply of the fluid mixture from the fluid nozzle and before the supply of the inert gas from the inert gas supplier.

This allows the fluid mixture to be reliably washed away by the rinse liquid, thus reliably preventing the deposits of particles and the like from remaining on the substrate.

(56)

The fluid nozzle may function as the rinse liquid supplier. In this case, the rinse liquid is supplied from the fluid nozzle. This obviates the need to provide the rinse liquid supplier separately from the fluid nozzle. As a result, the washing and drying processing can be reliably applied to the substrate with a simple structure.

(57)

The seventh processing unit may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, processing defects of the substrate are prevented reliably.

(58)

The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and has an opening that communicates with the gas flow passage.

In this case, the washing liquid flows through the liquid flow passage, and is discharged from the liquid discharge port, while the gas flows through the gas flow passage, and is discharged from the gas discharge port. The washing liquid and gas are mixed outside the fluid nozzle. A mist-like fluid mixture is thus generated.

In this way, the fluid mixture is generated by mixing the washing liquid and the gas outside the fluid nozzle. This obviates the need to provide space for mixing the washing liquid and the gas inside the fluid nozzle. As a result, the size of the fluid nozzle can be reduced.

(59)

The interface includes a fifth processing unit that applies given processing to the substrate, a platform on which the substrate is temporarily mounted, a fourth transport unit that transports the substrate between the processing section, the fifth processing unit, and the platform, and a fifth transport unit that transports the substrate between the platform, the exposure device, and the fourth processing unit.

In this case, the substrate is subjected to the given processing by the processing section, and then transported to the fifth processing unit from the processing section by the fourth transport unit. After the substrate is subjected to the given processing by the fifth processing unit, the substrate is transported to the platform by the fourth transport unit. Then, the substrate is transported to the exposure device from the platform by the fifth transport unit. After the substrate is subjected to the exposure processing by the exposure device, the substrate is transported to the fourth processing unit from the exposure device by the fifth transport unit. After the substrate is subjected to the drying processing by the fourth processing unit, the substrate is transported to the platform by the fifth transport unit. Then, the substrate is subsequently transported to the processing section from the platform by the fourth transport unit.

In this way, the disposition of the fifth processing unit in the interface and the transport of the substrate by the two transport units enables the addition of processing contents without increasing the footprint of the substrate processing apparatus.

In addition, the substrate after the exposure processing is immediately transported to the fourth processing unit, where the substrate is subjected to the drying processing by the fourth processing unit. In this case, even if a liquid is attached to the substrate in the exposure device, the liquid is removed immediately after the exposure processing. This sufficiently prevents dropping of a liquid in the substrate processing apparatus and the processing defects of the substrate.

(60)

The fifth transport unit may include third and fourth holders for holding the substrate, the fifth transport unit may hold the substrate with the third holder during the transport of the substrate from the substrate platform to the exposure device and from the fourth processing unit to the platform, and may hold the substrate with the fourth holder during the transport of the substrate from the exposure device to the fourth processing unit.

In this case, the third holder is used during the transport of the substrate to which no liquid is attached before the exposure processing and after the drying processing, while the fourth holder is used during the transport of the substrate to which a liquid is attached after the exposure processing. This prevents a liquid from attaching to the third holder, which prevents the attachment of a liquid to the substrate before the exposure processing. This prevents the attachment of particles and the like in the atmosphere to the substrate before the exposure processing, which prevents contamination inside the exposure device. As a result, it is possible to reduce processing defects of the substrate that may be generated during the exposure processing in the exposure device.

(61)

The fourth holder may be provided below the third holder. In this case, even if a liquid drops from the fourth holder and the substrate held thereon, the liquid will not attach to the third holder and the substrate held thereon. The liquid is thus reliably prevented from attaching to the substrate before the exposure processing and after the drying processing.

(62)

The processing section may further comprise a fourth processing block that includes an eighth processing unit that forms an anti-reflecting film on the substrate before the formation of the photosensitive film by the first processing unit, a fourth thermal processing unit that thermally treats the substrate, and a sixth transport unit that transports the substrate.

In this case, since the eighth processing unit forms the anti-reflection film on the substrate, potential standing waves and halation generated during the exposure processing can be reduced. As a result, processing defects of the substrate that may be generated during the exposure processing in the exposure device can be reduced more.

(63)

The substrate processing apparatus may further comprise an indexer that is arranged adjacent to another end of the processing section and carries in the substrate to the processing section and carries out the substrate from the processing section, wherein the fourth processing block may be arranged adjacent to the indexer.

In this case, an anti-reflection film is formed in the fourth processing block immediately after the transporting of the substrate to the processing section, and then a photosensitive film can be formed in the first processing block subsequently. This enables the smooth formation of the anti-reflection film and the photosensitive film on the substrate.

According to the invention, the addition of the third processing block to an existing substrate processing apparatus having the first and second processing blocks can reduce processing defects of the substrate during the exposure processing and after the exposure processing at low cost.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a schematic diagram of a nozzle in which a nozzle for washing processing and a nozzle for drying processing are formed integrally;

FIG. 9 is a schematic diagram showing another example of the nozzle for drying processing;

FIG. 12 is a schematic diagram showing another example of the washing processing unit;

FIGS. 17(a), 17(b), and 17(c) are diagrams for use in illustrating a method of applying washing and drying processing to the substrate using the two-fluid nozzle in FIG. 16.

DESCRIPTION OF THE PREFERRED EMBODIMENTS

A substrate processing apparatus according to embodiments of the invention will be described below with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

Each of the subsequent drawings is accompanied by the arrows that indicate X, Y, and Z directions perpendicular to one another, for clarification of positions. The X and Y directions are perpendicular to each other in a horizontal plane, and the Z direction corresponds to the vertical direction. In each of the directions, the direction toward an arrow is defined as + direction, and the opposite direction is defined as − direction. The rotation direction about the Z direction is defined as θ direction.

First Embodiment

A substrate processing apparatus according to a first embodiment of the invention will be described below with reference to FIGS. 1 to 4.

Figure 1:
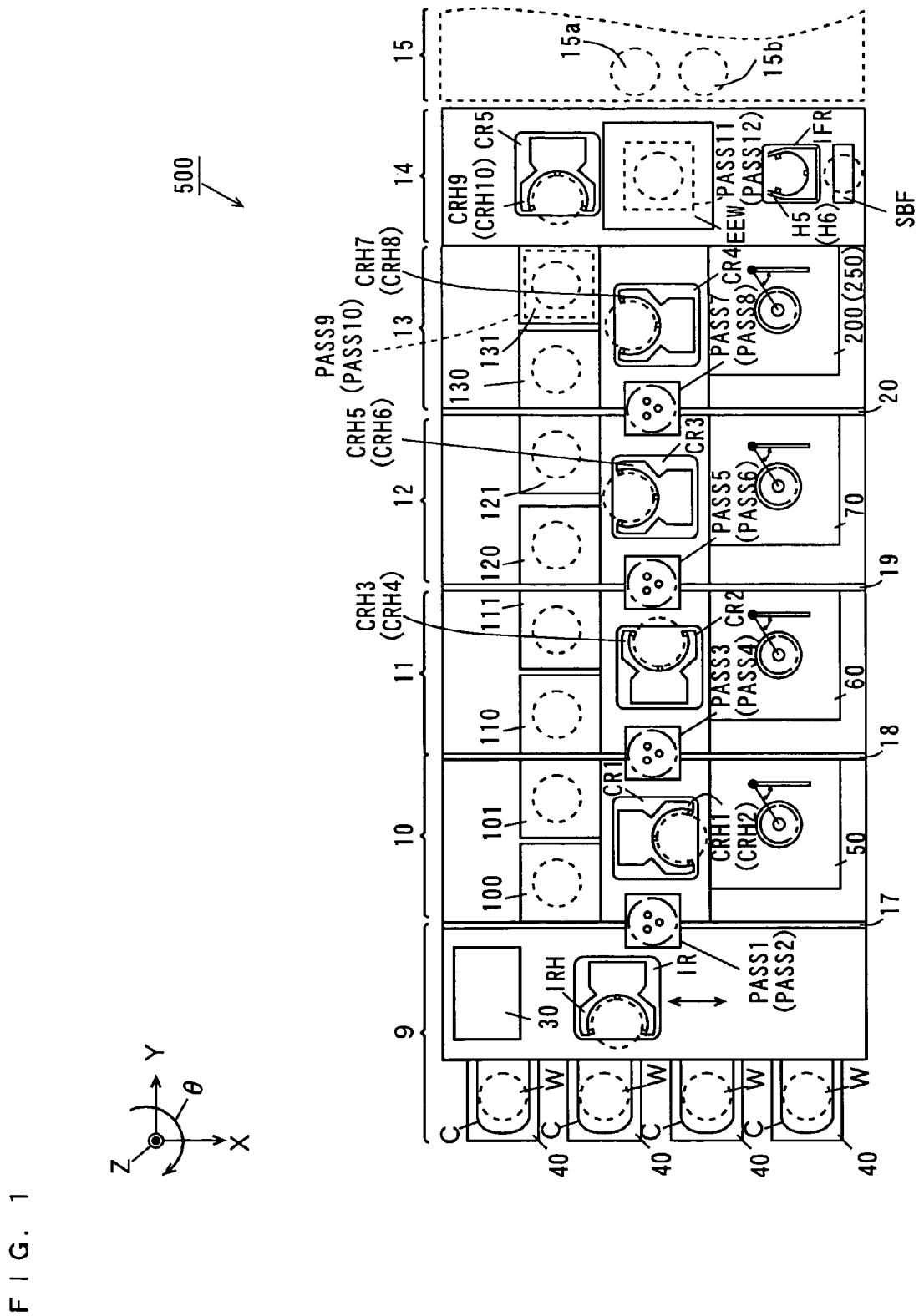
FIG. 1 is a plan view of a substrate processing apparatus according to a first embodiment of the invention.

FIG. 1 is a plan view of a substrate processing apparatus according to a first embodiment of the invention.

As shown in FIG. 1, the substrate processing apparatus 500 includes an indexer block 9, an anti-reflection film processing block 10, a resist film processing block 11, a development processing block 12, a processing block 13 for liquid immersion exposure processing and an interface block 14. An exposure device 15 is arranged adjacent to the interface block 14. The exposure device 15 applies exposure processing to substrates W by a liquid immersion method.

Each of the indexer block 9, anti-reflection film processing block 10, resist film processing block 11, development processing block 12, processing block 13 and interface block 14 will hereinafter be referred to as a processing block.

The indexer block 9 includes a main controller (controller) 30 for controlling the operation of each processing block, a plurality of carrier platforms 40, and an indexer robot IR. The indexer robot IR has a hand IRH for receiving and transferring the substrates W.

The anti-reflection film processing block 10 includes thermal processing groups 100, 101 for anti-reflection film, a coating processing group 50 for anti-reflection film, and a first central robot CR1. The coating processing group 50 is arranged opposite to the thermal processing groups 100, 101 with the first central robot CR1 therebetween. The first central robot CR1 has hands CRH1, CRH2 provided one above the other for receiving and transferring the substrates W.

A partition wall 17 is arranged between the indexer block 9 and the anti-reflection film processing block 10 for shielding an atmosphere. The partition wall 17 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS12 mentioned below similarly has such optical sensor and support pins.

The resist film processing block 11 includes thermal processing groups 110, 111 for resist film, a coating processing group 60 for resist film, and a second central robot CR2. The coating processing group 60 is arranged opposite to the thermal processing groups 110, 111 with the second central robot CR2 therebetween. The second central robot CR2 has hands CRH3, CRH4 provided one above the other for receiving and transferring the substrates W.

A partition wall 18 is arranged between the anti-reflection film processing block 10 and the resist film processing block 11 for shielding an atmosphere. The partition wall 18 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 70 and a third central robot CR3. The development processing group 70 is arranged opposite to the thermal processing groups 120, 121 with the third central robot CR3 therebetween. The third central robot CR3 has hands CRH5, CRH6 provided one above the other for receiving and transferring the substrates W.

A partition wall 19 is arranged between the resist film processing block 11 and the development processing block 12 for shielding an atmosphere. The partition wall 19 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The processing block 13 for liquid immersion exposure processing includes a thermal processing group 130 for resist cover film, a thermal processing group 131 for post-exposure bake, a coating processing group 200 for resist cover film, a removal processing group 250 for resist cover film, and a fourth central robot CR4. The thermal processing group 131, adjacent to the interface block 14, comprises substrate platforms PASS9, PASS10 as described below. The coating processing group 200 and the removal processing group 250 are arranged opposite to the thermal processing groups 130, 131 with the fourth central robot CR4 therebetween. The fourth central robot CR4 has hands CRH7, CRH8 provided one above the other for receiving and transferring the substrates W.

A partition wall 20 is arranged between the development processing block 12 and the processing block 13 for shielding an atmosphere. The partition wall 20 has substrate platforms PASS7, PASS8 provided closely one above the other for receiving and transferring the substrates W between the development processing block 12 and the processing block 13. The upper substrate platform PASS7 is used in transferring the substrates W from the development processing block 12 to the processing block 13, and the lower substrate platform PASS8 is used in transferring the substrates W from the processing block 13 to development processing block 12.

The interface block 14 includes a fifth central robot CR5, a feed buffer unit SBF, an interface transport mechanism IFR, and edge exposure units EEW. A return buffer unit RBF, and substrate platforms PASS 11, PASS12 are provided under the edge exposure units EEW as described below. The fifth central robot CR5 has hands CRH9, CRH10 provided one above the other for receiving and transferring the substrates W. The interface transport mechanism IFR has hands H5, H6 provided one above the other for receiving and transferring the substrates W.

In the substrate processing apparatus 500 of the embodiment, the indexer block 9, the anti-reflection film processing block 10, the resist film processing block 11, the development processing block 12, the processing block 13, and the interface block 14 are sequentially arranged in parallel along the Y direction.

Figure 2:
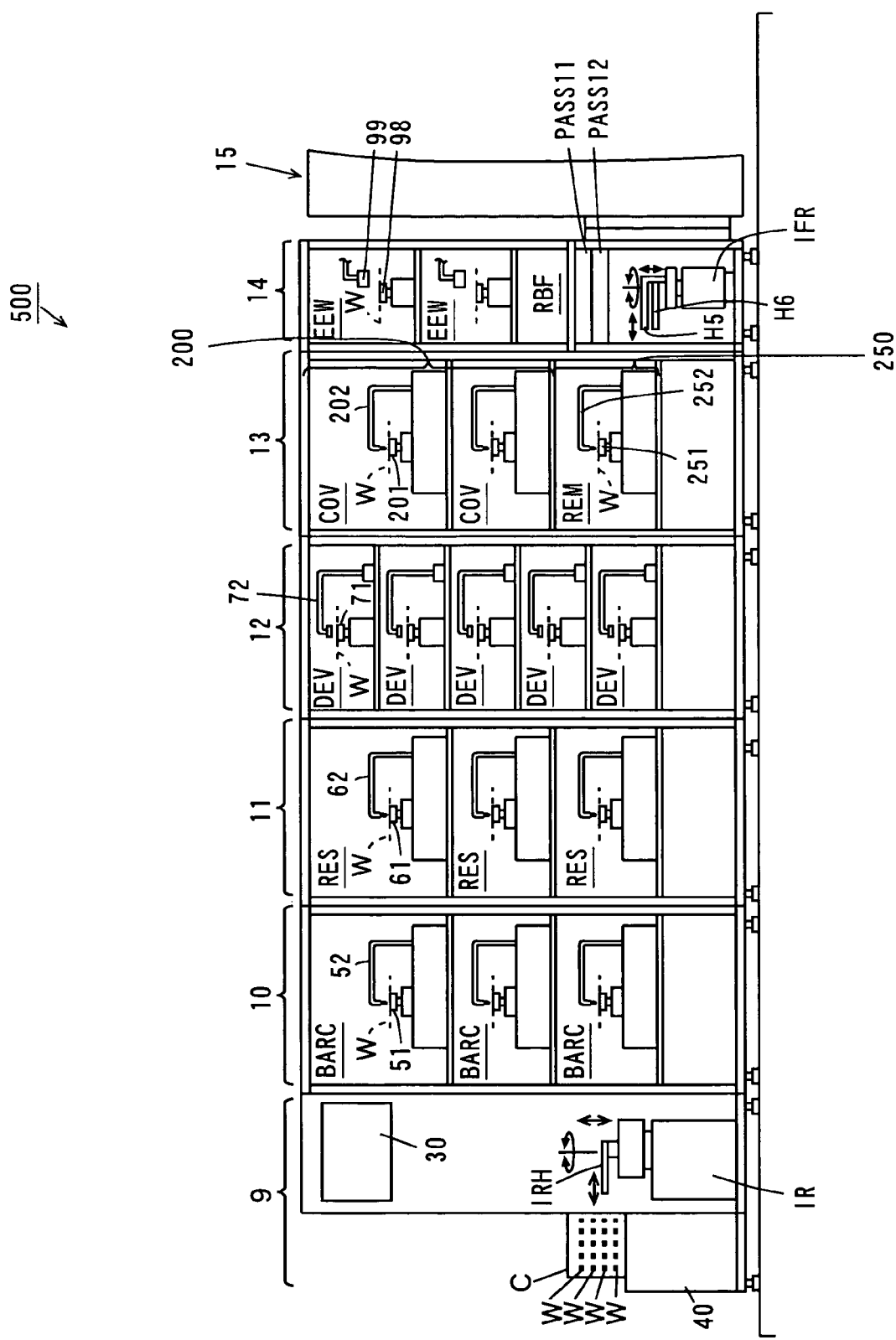
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 50 in the anti-reflection film processing block 10 (see FIG. 1) includes a vertical stack of three coating units BARC. Each of the coating units BARC comprises a spin chuck 51 for rotating a substrate W while holding the substrate W in a horizontal attitude by suction, and a supply nozzle 52 for supplying coating liquid for an anti-reflection film to the substrate W held on the spin chuck 51.

The coating processing group 60 in the resist film processing block 11 (see FIG. 1) includes a vertical stack of three coating units RES. Each of the coating units RES comprises a spin chuck 61 for rotating a substrate W while holding the substrate W in a horizontal attitude by suction, and a supply nozzle 62 for supplying coating liquid for a resist film to the substrate W held on the spin chuck 61.

The development processing group 70 in the development processing block 12 (see FIG. 1) includes a vertical stack of five development processing units DEV. Each of the development processing units DEV comprises a spin chuck 71 for rotating a substrate W while holding the substrate W in a horizontal attitude by suction, and a supply nozzle 72 for supplying development liquid to the substrate W held on the spin chuck 71.

The processing block 13 for liquid immersion exposure processing includes a vertical stack of the coating processing group 200 and the removal processing group 250. The coating processing group 200 includes a vertical stack of two coating units COV. Each of the coating units COV comprises a spin chuck 201 for rotating a substrate W while holding the substrate W in a horizontal attitude by suction, and a supply nozzle 202 for supplying coating liquid for a resist cover film to the substrate W held on the spin chuck 201. Materials having low affinity with resists and water (i.e., materials having low reactivity with resists and water), such as, for example, fluororesin, may be used as the coating liquid for resist cover film. Each of the coating units COV forms a resist cover film over the resist film formed on a substrate W by applying the coating liquid onto the substrate W while rotating the substrate W.

The removal processing group 250 in the processing block 13 includes a removal unit REM. The removal unit REM comprises a spin chuck 251 for rotating a substrate W in a horizontal attitude by suction, and a supply nozzle 252 for supplying stripping liquid (e.g., fluororesin) onto the substrate W held on the spin chuck 251. The removal units REM removes the resist cover film formed on a substrate W by applying the stripping liquid onto the substrate W while rotating the substrate W.

Note that the method of removing resist cover films by the removal unit REM is not limited to the example shown above. For example, a resist cover film may be removed by supplying stripping liquid onto a substrate W while allowing a slit nozzle to move above the substrate W.

The interface block 14 includes a vertical stack of two edge exposure units EEW, a return buffer unit RBF, and substrate platforms PASS11, PASS12, and also includes the fifth central robot CR5 (see FIG. 1) and interface transport mechanism IFR. Each of the edge exposure units EEW comprises a spin chuck 98 for rotating a substrate W while holding the substrate W in a horizontal attitude by suction, and a light irradiator 99 for subjecting a peripheral edge of the substrate W held on the spin chuck 98 to exposure.

Figure 3:
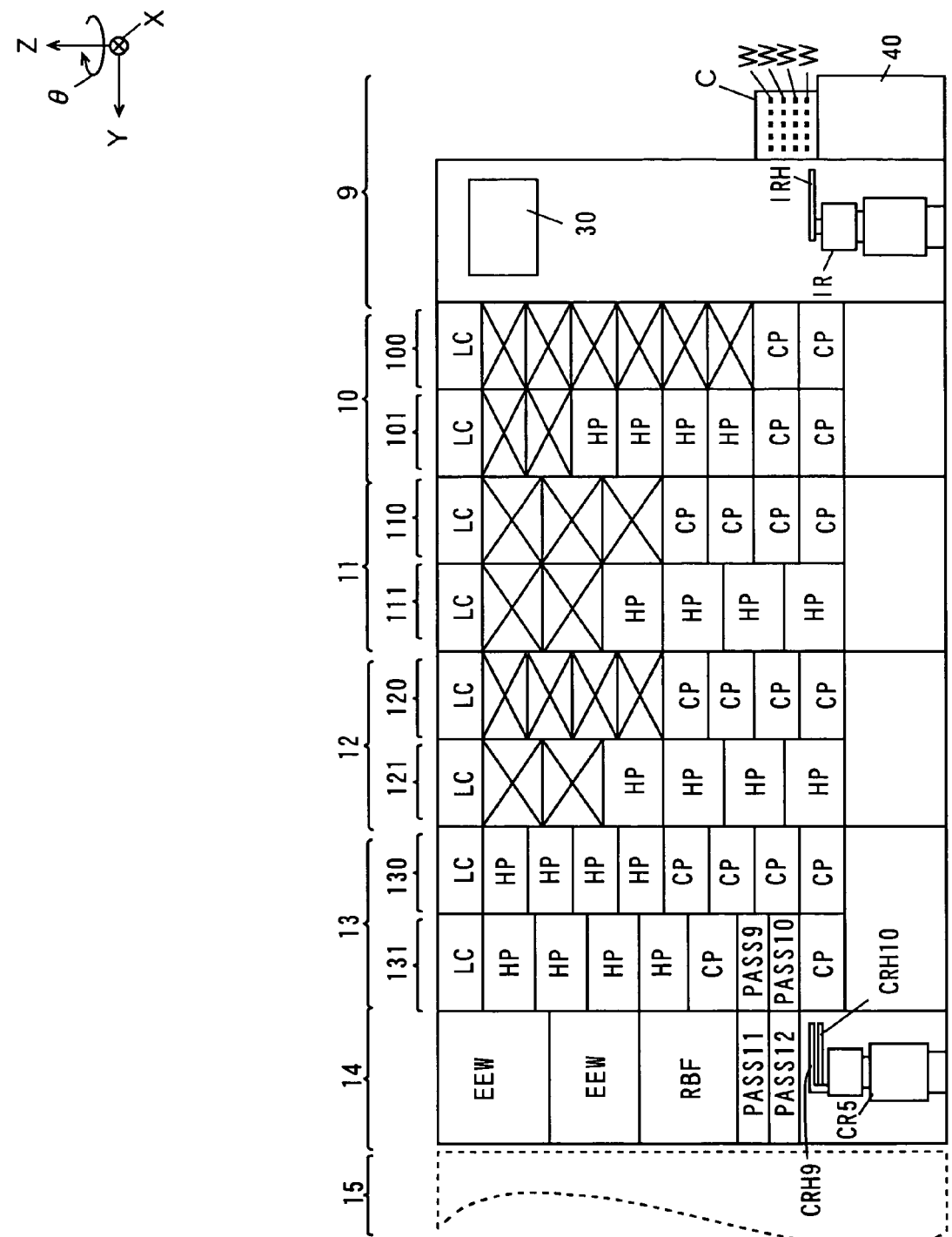
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two cooling units (cooling plates) CP, and the thermal processing group 101 includes a vertical stack of four heating units (hot plates) HP and two cooling units CP. The thermal processing group 100 also includes a local controller LC on top thereof for controlling the temperatures of the cooling units CP, and the thermal processing group 101 also includes a local controller LC on top thereof for controlling the temperatures of the heating units HP and the cooling units CP.

In the resist film processing block 11, the thermal processing group 110 includes a vertical stack of four cooling units CP, and the thermal processing group 111 includes a vertical stack of four heating units HP. The thermal processing group 110 also includes a local controller LC on top thereof for controlling the temperatures of the cooling units CP, and the thermal processing group 111 also includes a local controller LC on top thereof for controlling the temperatures of the heating units HP.

In the development processing block 12, the thermal processing group 120 includes a vertical stack of four cooling units CP, and the thermal processing group 121 includes a vertical stack of four heating units HP. The thermal processing group 120 also includes a local controller LC on top thereof for controlling the temperatures of the cooling units CP and the cooling plates CP, and the thermal processing group 121 also includes a local controller LC for controlling the temperatures of the heating units HP.

In the processing block 13, the thermal processing group 130 includes a vertical stack of four heating units HP and four cooling units CP, and the thermal processing group 131 includes a vertical stack of four heating units HP, a cooling unit CP, substrate platforms PASS9, PASS10, and a cooling unit CP. The thermal processing group 130 also includes a local controller LC on top thereof for controlling the temperatures of the heating units HP and the cooling units CP, and the thermal processing group 131 also includes a local controller LC on top thereof for controlling the temperatures of the heating units HP and the cooling units CP.

Next, the operation of the substrate processing apparatus 500 in this embodiment will be described.

Carriers C for storing the substrates W in multiple stages are mounted on the carrier platforms 40, respectively, in the indexer block 9. The indexer robot IR takes out a substrate W yet to be processed which is stored in a carrier C using the hand IRH. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the fifth central robot CR5, and the interface transport mechanism IFR, multi-joint type transport robots that linearly move their hands forward and backward by moving their joints may also be used.

The unprocessed substrate W that has been transferred onto the substrate platform PASS1 is received by the first central robot CR1 in the anti-reflection film processing block 10. The first central robot CR1 carries the substrate W to the thermal processing group 100. Then, the first central robot CR1 takes out the thermally treated substrate W from the thermal processing group 100, and carries the substrate W to a coating processing group 50. The coating processing group 50 forms a coating of an anti-reflection film on a substrate W using a coating unit BARC, in order to reduce potential standing waves and halation generated during exposure.

The first central robot CR1 subsequently takes out the substrate W after the coating processing from the coating processing group 50, and carries the substrate W to the thermal processing group 100 or 101. Then, the first central robot CR1 takes out the thermally treated substrate W from the thermal processing group 100 or 101, and transfers the substrate W to the substrate platform PASS3.

The substrate W on the substrate platform PASS3 is received by the second central robot CR2 in the resist film processing block 11. The second central robot CR2 carries the substrate W to the thermal processing group 110. Then, the second central robot CR2 takes out the thermally treated substrate W from the thermal processing group 110, and carries the substrate W to a coating processing group 60. The coating processing group 60 forms a coating of an anti-reflection film over a lower portion of a resist film over the substrate W coated with the anti-reflection film by a coating unit RES.

After this, the second central robot CR2 takes out the substrate W after the coating processing from the coating processing group 60, and carries the substrate W to the thermal processing group 110 or 111. Then, the second central robot CR2 takes out the thermally treated substrate W from the thermal processing group 110 or 111, and transfers the substrate W onto the substrate platform PASS5.

The substrate W on the substrate platform PASS5 is received by the third central robot CR3 in the development processing block 12. The third central robot CR3 transfers the substrate W onto the substrate platform PASS7.

The substrate W on the substrate platform PASS7 is received by the fourth central robot CR4 in the processing brock 13. The fourth central robot CR4 carries the substrate W to the thermal processing group 130. Then, the fourth central robot CR4 takes out the thermally treated substrate W from the thermal processing group 130, and carries the substrate W to a coating processing group 200. The coating processing group 200 forms a coating of a resist cover film over the resist film by a coating unit COV.

After this, the fourth central robot CR4 takes out the substrate W after the coating processing from the coating processing group 200, and carries the substrate W to the thermal processing group 130.

Then, the fourth central robot CR4 takes out the thermally treated substrate W from a thermal processing group 130, and transfers the substrate W onto the substrate platforms PASS9. The substrate W transferred to the substrate platform PASS 9 is received with the upper hand CRH9 of a fifth central robot CR5 in the interface block 14. The fifth central robot CR5 carries the substrate W to an edge exposure unit EEW with the hand CRH9. The edge exposure unit EEW applies exposure processing to the peripheral portion of the substrate W.

Then, the fifth central robot CR5 takes out the substrate W after the edge exposure processing from the edge exposure unit EEW with the hand CRH9. The fifth central robot CR5 then transfers the substrate W onto the substrate platform PASS11 with the hand CRH9.

The substrate W on the substrate platform PASS11 is carried into the exposure device 15 by the interface transport mechanism IFR. After the exposure processing has been applied to the substrate W by the exposure device 15, the interface transport mechanism IFR transports the substrate W onto the substrate platform PASS12. The interface transport mechanism IFR will be described below.

The substrate W on the substrate platform PASS12 is received by the lower hand CRH10 of the fifth central robot CR5 in the interface block 14. The fifth central robot CR5 carries the substrate W into the thermal processing group 131 in the processing block 13 with the hand CRH10. The substrate W is subjected to a post-exposure bake (PEB) by the thermal processing group 131. After this, the fifth central robot CR5 takes out the thermally treated substrate W from the thermal processing group 131, and transfers the substrate W onto the substrate platform PASS10.

The substrate W on the substrate platform PASS10 is received by the fourth central robot CR4 in the processing block 13. The fourth central robot CR4 carries the substrate W into the removal processing group 250. The removal processing group 250 removes the resist cover film by the removal unit REM.

After this, the fourth central robot CR4 takes out the processed substrate W from the removal processing group 250, and transfers the substrate W onto the substrate platform PASS8.

The substrate W on the substrate platform PASS8 is received by a third central robot CR3 in the development processing block 12. The central robot CR3 carries the substrate W to a development processing group 70. The development processing group applies development processing to the substrate W by the development processing unit DEV.

After this, the third central robot CR3 takes out the substrate W after the development processing from the development processing group 70, and carries the substrate W to the thermal processing group 120 or 121. Then, the third central robot CR3 take out the thermally treated substrate W from the thermal processing group 120 or 121, and transfers the substrate W onto the substrate platform PASS6.

The substrate W on the substrate platform PASS6 is transferred onto the substrate platform PASS4 by the second central robot CR2 in the resist film processing block 11. The substrate W on the substrate platform PASS4 is transferred onto the substrate platform PASS2 by the first central robot CR1 in the anti-reflection film processing block 10.

The substrate W on the substrate platform PASS2 is stored in a carrier C by the indexer robot IR in the indexer block 9. Each of the processing to the substrate W in the substrate processing apparatus is thus completed.

If the removal processing group 250 is temporarily not capable of receiving the substrate W, the substrate W may temporarily be stored in the return buffer unit RBF in the interface block 14 after the post-exposure bake in the thermal processing group 131.

As described above, in the substrate processing apparatus 500 according to this embodiment, a resist cover film is formed over a resist film formed on a substrate W by the coating unit COV in the processing block 13 before the substrate W is subjected to exposure processing by the exposure device 15. Even if the substrate W is in contact with a liquid in the exposure device 15 in this case, the resist cover film prevents the contact of the resist film with the liquid, which prevents the component of the resist from being eluted in the liquid. This reduces contamination inside the exposure device 15 while preventing the component of the resist from remaining on a surface of the substrate W. This results in reduced processing defects in substrates W during the exposure processing in the exposure device 15.

Moreover, the resist cover film is removed by the removal unit REM in the processing block 13 before the substrate W is subjected to the development processing in the development processing block 12. This ensures the removal of the resist cover film before the development processing, allowing the development processing to be reliably applied to the substrate W. This reduces the processing defects of the substrate W in the development processing unit DEV after the exposure processing.

In addition, since the processing block 13 is arranged adjacent to the interface block 14, the resist cover film can be formed immediately before the exposure processing and the resist cover film can be removed immediately after the exposure processing.

Moreover, in this embodiment, a processing unit (the coating unit COV) that applies given processing to the substrate W before the exposure processing and a processing unit (the removal unit REM) that applies given processing to the substrate W after the exposure processing can be provided in a single processing block. This reduces the footprint of the substrate processing apparatus 500.

Furthermore, in this embodiment, since the substrate processing apparatus 500 has the structure in which the processing blocks 13 is added to an existing substrate processing apparatus, processing defects that may be generated during the exposure processing and after the exposure processing can be reduced at low cost.

Figure 4:
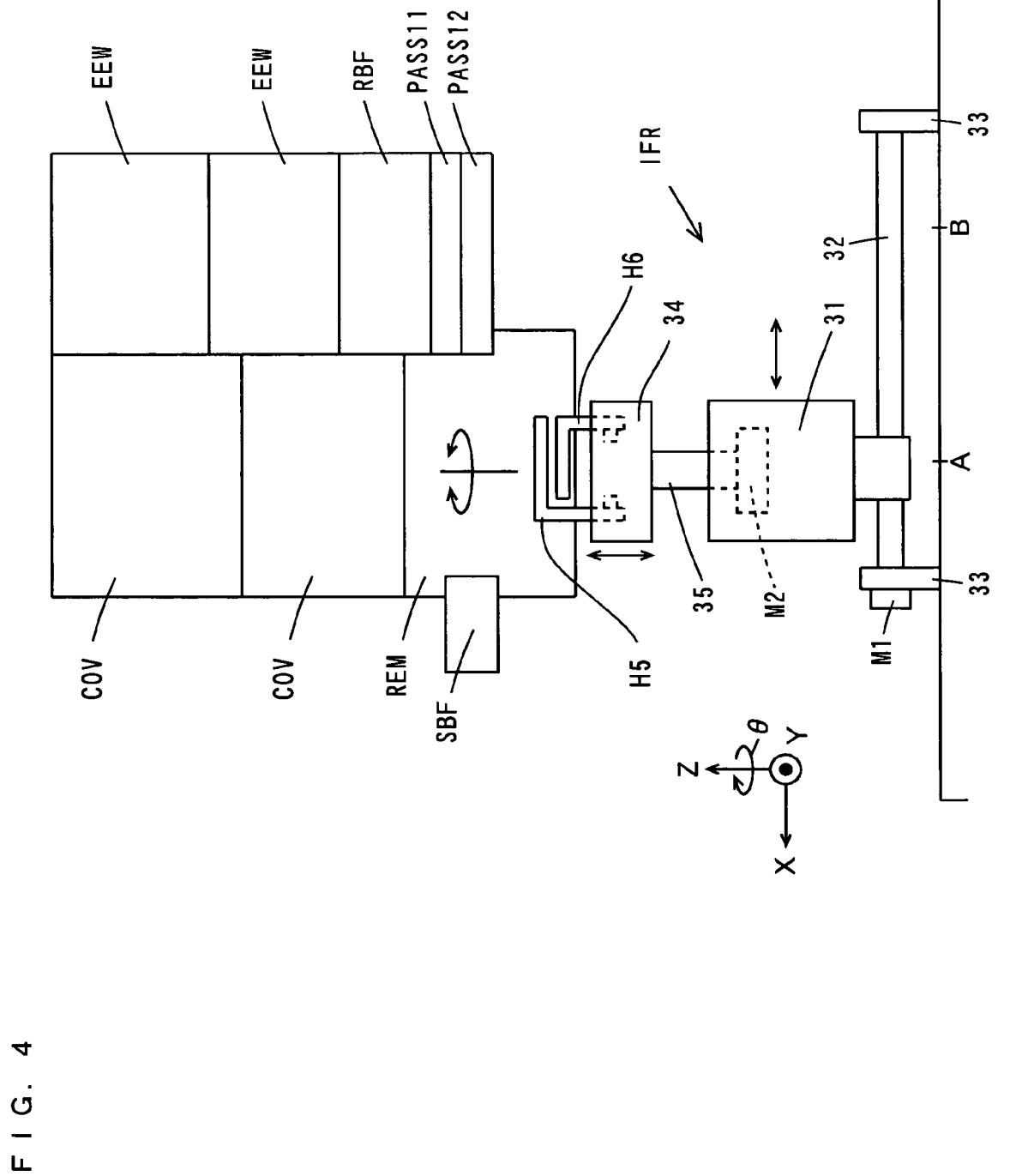
FIG. 4 is a diagram for use in illustrating the configuration and operation of the interface transport mechanism.

The interface transport mechanism IFR is next described. FIG. 4 is a diagram for use in illustrating the configuration and operation of the interface transport mechanism IFR.

The configuration of the interface transport mechanism IFR is first described. As shown in FIG. 4, a movable base 31 in the interface transport mechanism IFR is threadably mounted to a screwed shaft 32. The screwed shaft 32 is rotatably supported with support bases 33 so as to extend in the X direction. One end of the screwed shaft 32 is provided with a motor M1, which causes the screwed shaft 32 to rotate and the movable base 31 to horizontally move in the ±X direction.

A hand support base 34 is mounted on the movable base 31 so as to rotate in the ±θ direction while moving up and down in the ±Z direction. The hand support base 34 is coupled to a motor M2 in the movable base 31 through a rotation shaft 35, and rotated by the motor M2. Two hands H5, H6 for holding the substrate W in a horizontal attitude are mounted to the hand support base 34 one above the other so as to move forward and backward.

The operation of the interface transport mechanism IFR is next described. The operation of the interface transport mechanism IFR is controlled by the main controller 30 in FIG. 1.

The interface transport mechanism IFR initially rotates the hand support base 34 at the position A in FIG. 4 while lifting the hand support base 34 in the +Z direction, to allow the upper hand H5 to enter the substrate platform PASS11. When the hand H5 has received the substrate W in the substrate platform PASS11, the interface transport mechanism IFR retracts the hand H5 from the substrate platform PASS11, and lowers the hand support base 34 in the −Z direction.

The interface transport mechanism IFR subsequently moves in the −X direction, and rotates the hand support base 34 at the position B while allowing the hand H5 to enter a substrate inlet 15a in the exposure device 15 (see FIG. 1). After the hand H5 has carried the substrate W into the substrate inlet 15a, the interface transport mechanism IFR retracts the hand H5 from the substrate inlet 15a.

Then, the interface transport mechanism IFR allows the lower hand H6 to enter a substrate outlet 15b in the exposure device 15 (see FIG. 1). When the hand H6 has received the substrate W after the exposure processing from the substrate outlet 15b, the interface transport mechanism IFR retracts the hand H6 from the substrate outlet 15b.

After this, the interface transport mechanism IFR moves in the +X direction, and rotates the hand support base 34 at the position A while allowing the hand H5 to enter the substrate platform PASS12, and transfers the substrate W thereon.

If the exposure device 15 is not capable of receiving the substrate W during the transport of the substrate W from the substrate platform PASS11 to the exposure device 15, the substrate W is temporarily stored in the feed buffer unit SBF.

As described above, in this embodiment, the hand H5 of the interface transport mechanism IFR is used during the transport of the substrate W from the substrate platform PASS11 to the exposure device 15, while the hand H6 is used during the transport of the substrate W from the exposure device 15 to the substrate platform PASS12. That is, the hand H6 is used for transporting the substrate W to which a liquid is attached immediately after the exposure processing, while the hand H5 is used for transporting the substrate W to which no liquid is attached. This prevents the liquid on the substrate W from attaching to the hand H5.

Moreover, since the hand H6 is arranged below the hand H5, even if a liquid drops from the hand H6 and the substrate W held thereon, the liquid will not attach to the hand H5 and the substrate W held thereon.

Furthermore, as described above, the fifth central robot CR5 also employs the lower hand CRH10 during the transport of the substrate W to which a liquid is attached after the exposure processing (between the substrate platform PASS12 and the thermal processing group 131), and employs the upper hand CRH9 during the transport of the substrate W to which no liquid is attached before the exposure processing (between the substrate platform PASS9 and the edge exposure units EEW, and between the edge exposure units EEW and the substrate platform PASS11). This prevents a liquid from attaching to the substrate W before the exposure processing also in the fifth central robot CR5.

As a result of the foregoing, a liquid is prevented from attaching to the substrate W before the exposure processing, which prevents the contamination of the substrate W due to the attachment of particles and the like in the atmosphere. This prevents the generation of processing defects of the substrate W during the exposure processing in the exposure device 15.

In this embodiment, the substrates W are transported from the substrate platform PASS11 to the exposure device 15, and from the exposure device 15 to the substrate platform PASS12 by the single interface transport mechanism IFR. However, the substrates W may also be carried using a plurality of interface transport mechanisms.

In addition, the operation and configuration of the interface transport mechanism IFR may be modified according to the positions of the substrate inlet 15a and the substrate outlet 15b in the exposure device 15. For example, when the substrate inlet 15a and the substrate outlet 15b in the exposure device 15 are positioned opposite to the position A in FIG. 4, the screwed shaft 32 in FIG. 4 may be omitted.

Furthermore, the numbers of the coating units BARC, RES, COV, the development processing units DEV, the washing processing unit SOAK, the removal unit REM, the heating units HP, and the cooling units CP may suitably be changed according to the processing speed of each processing block.

Second Embodiment

Figure 5:
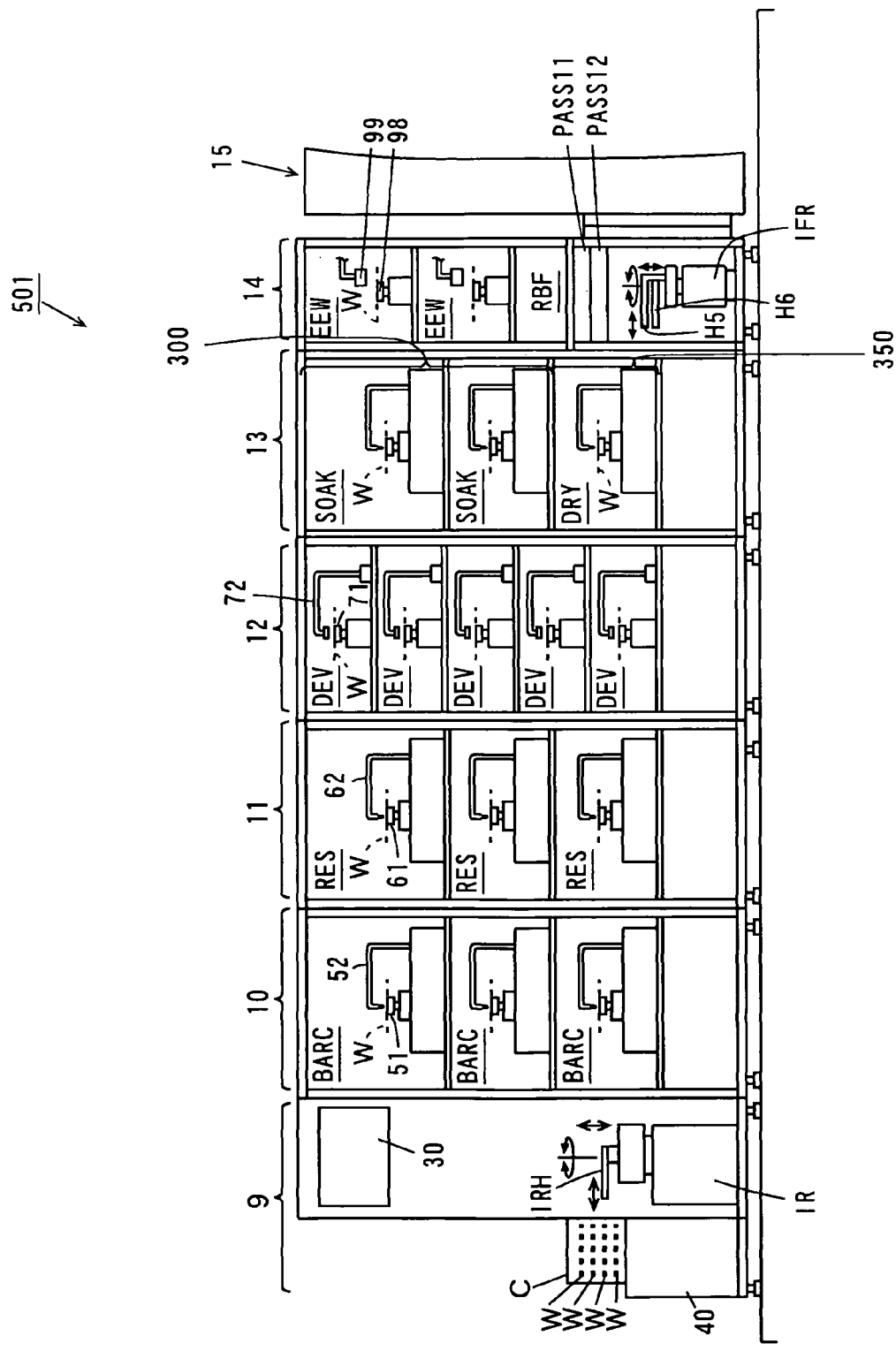
FIG. 5 is a side view of a substrate processing apparatus according to a second embodiment of the invention.

FIG. 5 is a side view of the substrate processing apparatus 501 according to a second embodiment. A substrate processing apparatus 501 shown in FIG. 5 is different from the substrate processing apparatus 500 shown in FIG. 2 in that a vertical stack of a washing processing group 300 and a drying processing group 350 are provided in the processing block 13, instead of the coating processing group 200 and the removal processing group 250.

The processing block 13 for lipuid immersion exposure processing includes a vertical stack of the washing processing group 300 and the drying processing group 350. The washing processing group 300 in the processing block 13 includes a vertical stack of two washing processing units SOAK. Each of the washing processing units SOAK applies washing and drying processing to a substrate W. The washing processing units SOAK will be described in detail below.

The drying processing group 350 in the processing block 13 includes a drying processing unit DRY. The drying processing unit DRY is similar to the washing processing unit SOAK in configuration, and applies washing and drying processing to a substrate W.

The operation of the substrate processing apparatus 501 in this embodiment will be described below. Note that, the operation of the indexer block 9, the anti-reflection film processing block 10, the resist film processing block 11, and the development processing block 12 is similar to that of the first embodiment.

The substrate W that has been transferred onto the substrate platform PASS7 (see FIG. 1) through the indexer block 9, the anti-reflection film processing block 10, the resist film processing block 11, and the development processing block 12 is received by the fourth central robot CR4 (see FIG. 1) in the processing block 13. The fourth central robot CR4 carries the substrate W to the washing processing group 300 in FIG. 5. As described above, in the washing processing group 300, the substrate W is subjected to the washing and drying processing by the washing processing unit SOAK.

Then, the fourth central robot CR4 takes out the substrate W after the washing processing from the washing processing group 300, and transfers the substrate W onto the substrate platform PASS9 (see FIG. 1). The substrate W on the substrate platform PASS9 is received by the fifth central robot CR5 (see FIG. 1) in the interface block 14. Then, the fifth central robot CR5 carries the substrate W to an edge exposure unit EEW in FIG. 5. The edge exposure unit EEW applies exposure processing to the peripheral portion of the substrate W.

After this, the fifth central robot CR5 takes out the substrate W after the edge exposure processing from the edge exposure unit EEW, and transfers the substrate W onto the substrate platform PASS11. Then, the interface transport mechanism IFR carries the substrate W from the substrate platform PASS11 to the exposure device 15 with the upper hand H5. In the exposure device 15, the substrate W is subjected to exposure processing by the liquid immersion method.

The interface transport mechanism IFR subsequently carries the substrate W after the exposure processing from exposure device 15 to the drying processing group 350 with the lower hand H6. As described above, in the drying processing group 350, the substrate W is subjected to the drying processing by the drying processing unit DRY.

Then, the interface transport mechanism IFR transfers the substrate W after the drying processing onto the substrate platform PASS12 from the drying processing group 350 with the hand H5.

The substrate W on the substrate platform PASS12 is received by the fifth central robot CR5 in the interface block 14. The fifth central robot CR5 carries the substrate W into the thermal processing group 131 (see FIG. 1) in the processing block 13. The substrate W is subjected to a post-exposure bake (PEB) by the thermal processing group 131. After this, the fifth central robot CR5 takes out the thermally treated substrate W from the thermal processing group 131, and transfers the substrate W onto the substrate platform PASS10 (see FIG. 1).

The substrate W on the substrate platform PASS10 is received by the fourth central robot CR4 in the processing block 13. The fourth central robot CR4 transfers the substrate W onto the substrate platform PASS8.

The substrate W on the substrate platform PASS8 is transferred to the carrier C through the development processing block 12, the resist film processing block 11, the anti-reflection film processing block 10, and the indexer block 9.

Now, the aforementioned washing processing units SOAK will be described in detail with reference to drawings.

Figure 6:
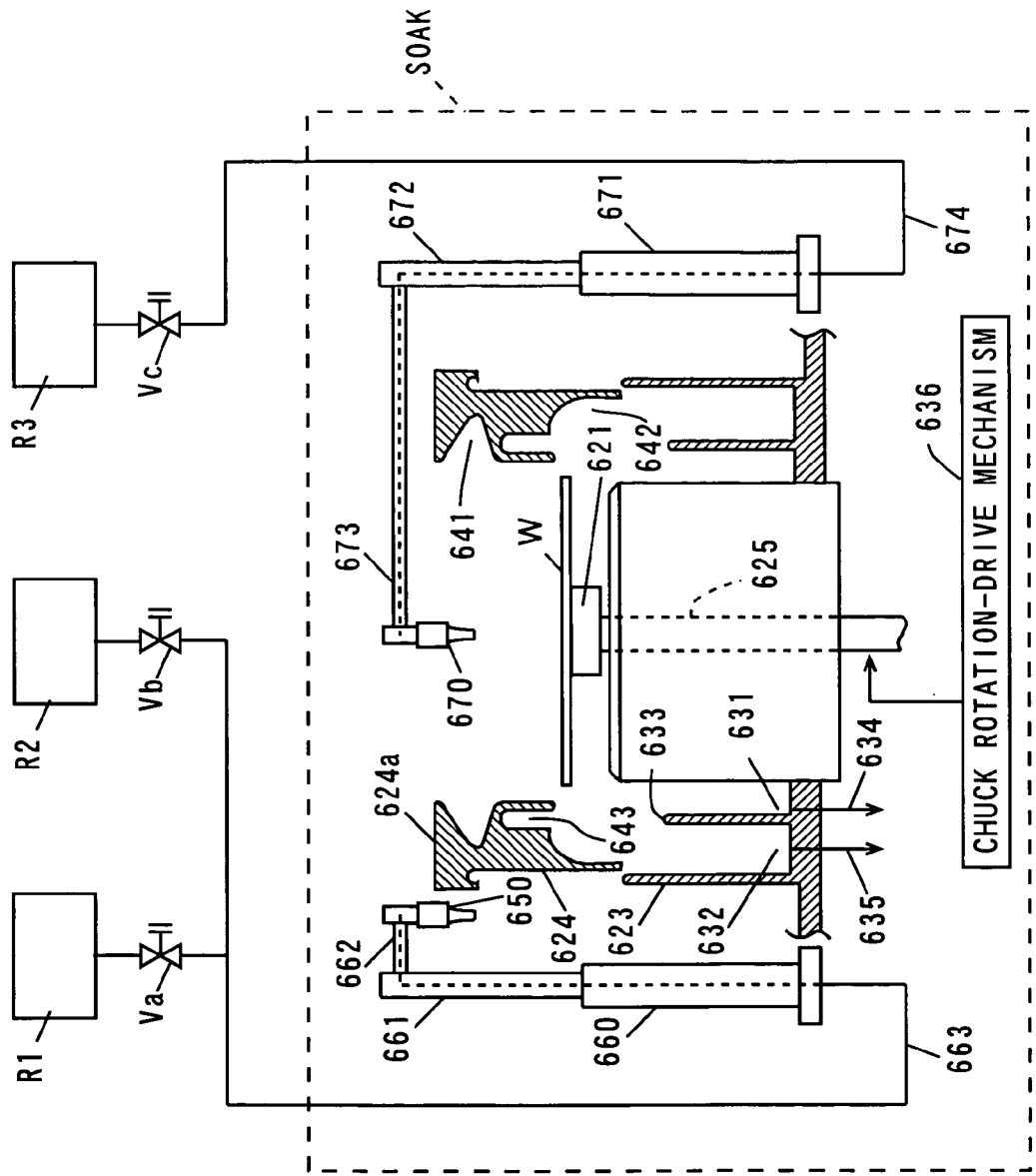
FIG. 6 is a diagram for use in illustrating the configuration of the washing processing unit.

The configuration of a washing processing unit SOAK is first described. FIG. 6 is a diagram for use in illustrating the configuration of the washing processing unit SOAK.

As shown in FIG. 6, the washing processing unit SOAK comprises a spin chuck 621 for rotating a substrate W about the vertical rotation axis passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a lower surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for washing processing.

The first rotation shaft 661 is rotated by the first rotation motor 660, so that the first arm 662 swings. This causes the nozzle 650 to move above the substrate W held on the spin chuck 621.

A supply pipe 663 for washing processing is arranged so as to pass through the inside of the first rotation motor 660, the first rotation shaft 661, and the first arm 662. The supply pipe 663 is connected to a washing liquid supply source R1 and a rinse liquid supply source R2 through a valve Va and a valve Vb, respectively. By controlling the opening and closing of the valves Va, Vb, it is possible to select a processing liquid supplied to the supply pipe 663 and adjust the amount of the processing liquid. In the configuration of FIG. 6, when the valve Va is opened, washing liquid is supplied to the supply pipe 663, and when the valve Vb is opened, rinse liquid is supplied to the supply pipe 663.

The washing liquid or the rinse liquid is supplied to the nozzle 650 through the supply pipe 663 from the washing liquid supply source R1 or the rinse liquid supply source R2. The washing liquid or the rinse liquid is thus supplied to a surface of the substrate W. Examples of the washing liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, which extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the surface of the substrate W. Nitrogen gas ($N_2$), for example, may be used as the inert gas.

When supplying the washing liquid or the rinse liquid onto the surface of the substrate W, the nozzle 650 is positioned above the substrate. When supplying the inert gas onto the surface of the substrate W, the nozzle 650 is retracted to a predetermined position.

When supplying the washing liquid or the rinse liquid onto the surface of the substrate W, the nozzle 670 is retracted to a predetermined position. When supplying the inert gas onto the surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., washing liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Also, a liquid recovery guide 642 having an inclined surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 6), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With such a configuration, discharge and recovery of the processing liquid is performed.

The processing operation of the washing processing unit SOAK having the aforementioned configuration is next described. Note that the operation of each component in the washing processing unit SOAK described below is controlled by the main controller 30 in FIG. 5.

When the substrate W is initially carried into the washing processing unit SOAK, the guard 624 is lowered, and the substrate W is transferred onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the washing liquid is discharged onto the top surface of the substrate W from the nozzle 650. The substrate W is thus washed, and part of the component of the resist on the substrate W is eluted in the washing liquid. During the washing, the substrate W is rotated as the washing liquid is supplied onto the substrate W. This causes the washing liquid on the substrate W to constantly move toward a peripheral portion of the substrate W by the centrifugal force, and splashed away. It is therefore possible to prevent the component of the resist eluted in the washing liquid from remaining on the substrate W. Note that the aforementioned resist component may be eluted with pure water being poured onto the substrate Wand kept thereon for a certain period. The supply of the washing liquid onto the substrate W may also be executed by a soft spray method using a two-fluid nozzle.

After the elapse of a predetermined time, the supply of the washing liquid is stopped, and the rinse liquid is discharged from the nozzle 650. The washing liquid on the substrate W is thus washed away. As a result, it is possible to reliably prevent the resist components eluted in the washing liquid from remaining on the substrate W.

Figure 7:
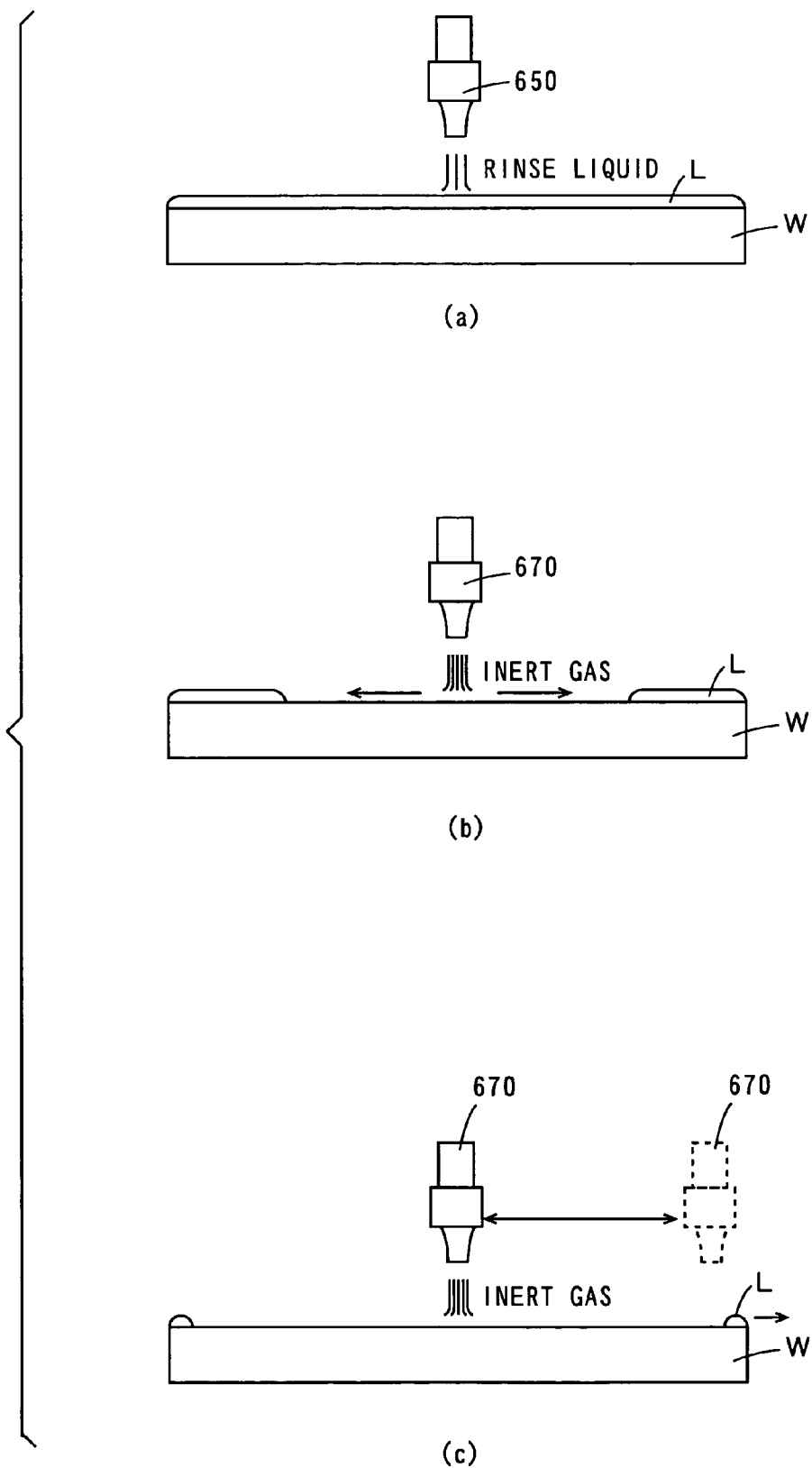
FIG. 7(a), 7(b), and 7(c) are diagrams for use in illustrating the operation of the washing processing unit.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire surface of the substrate W, as shown in FIG. 7(*a*). Alternatively, the rotation of the rotation shaft 625 may be stopped to form the liquid layer L over the entire surface of the substrate W.

The embodiment employs the configuration in which the nozzle 650 is used for supplying both the washing liquid and the rinse liquid, so as to supply both the washing liquid and the rinse liquid from the nozzle 650. However, a configuration may also be employed in which nozzles are separately provided for supplying the washing liquid and the rinse liquid.

In order to prevent the rinse liquid from flowing to the back surface of the substrate W during the supply of the rinse liquid, pure water may be supplied to the back surface of the substrate W using a back rinsing nozzle (not shown).

Note that when using pure water as the washing liquid for washing the substrate W, it is not necessary to supply the rinse liquid.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 7(*b*).

Next, as the number of revolutions of the rotation shaft 625 (see FIG. 6) increases, the nozzle 670 gradually moves from above the center of the substrate W to above the peripheral portion thereof, as shown in FIG. 7(*c*). This causes a great centrifugal force acting on the liquid layer L on the substrate W while allowing the inert gas to be sprayed toward the entire surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the substrate W is carried out of the washing processing unit SOAK. The processing operation of the washing processing unit SOAK is thus completed.

It is preferred that the position of the guard 624 during washing and drying processing is suitably changed according to the necessity of the recovery or discharge of the processing liquid.

Moreover, although the washing processing unit SOAK shown in FIG. 6 includes the nozzle 650 for washing processing and the nozzle 670 for drying processing separately, the nozzle 650 and the nozzle 670 may also be formed integrally, as shown in FIG. 8. This obviates the need to move each of the nozzle 650 and the nozzle 670 separately during the washing or drying processing to the substrate W, thereby simplifying the driving mechanism.

A nozzle 770 for drying processing as shown in FIG. 9 may also be used instead of the nozzle 670 for drying processing.

The nozzle 770 in FIG. 9 extends vertically downward, and also has branch pipes 771, 772 that extend obliquely downward from sides thereof. A gas discharge port 770*a* is formed at the lower end of the branch pipe 771, a gas discharge port 770*b* at the lower end of the nozzle 770, and a gas discharge port 770*c* at the lower end of the branch pipe 772, each for discharging an inert gas. The discharge port 770*b* discharges an inert gas vertically downward, and the discharge ports 770*a*, 770*c* each discharge an inert gas obliquely downward, as indicated by the arrows in FIG. 9. That is to say, the nozzle 770 discharges the inert gas so as to increase the spraying area downwardly.

Now, a washing processing unit SOAK using the nozzle 770 for drying processing applies drying processing to the substrate W as will be described below.

Figure 10:
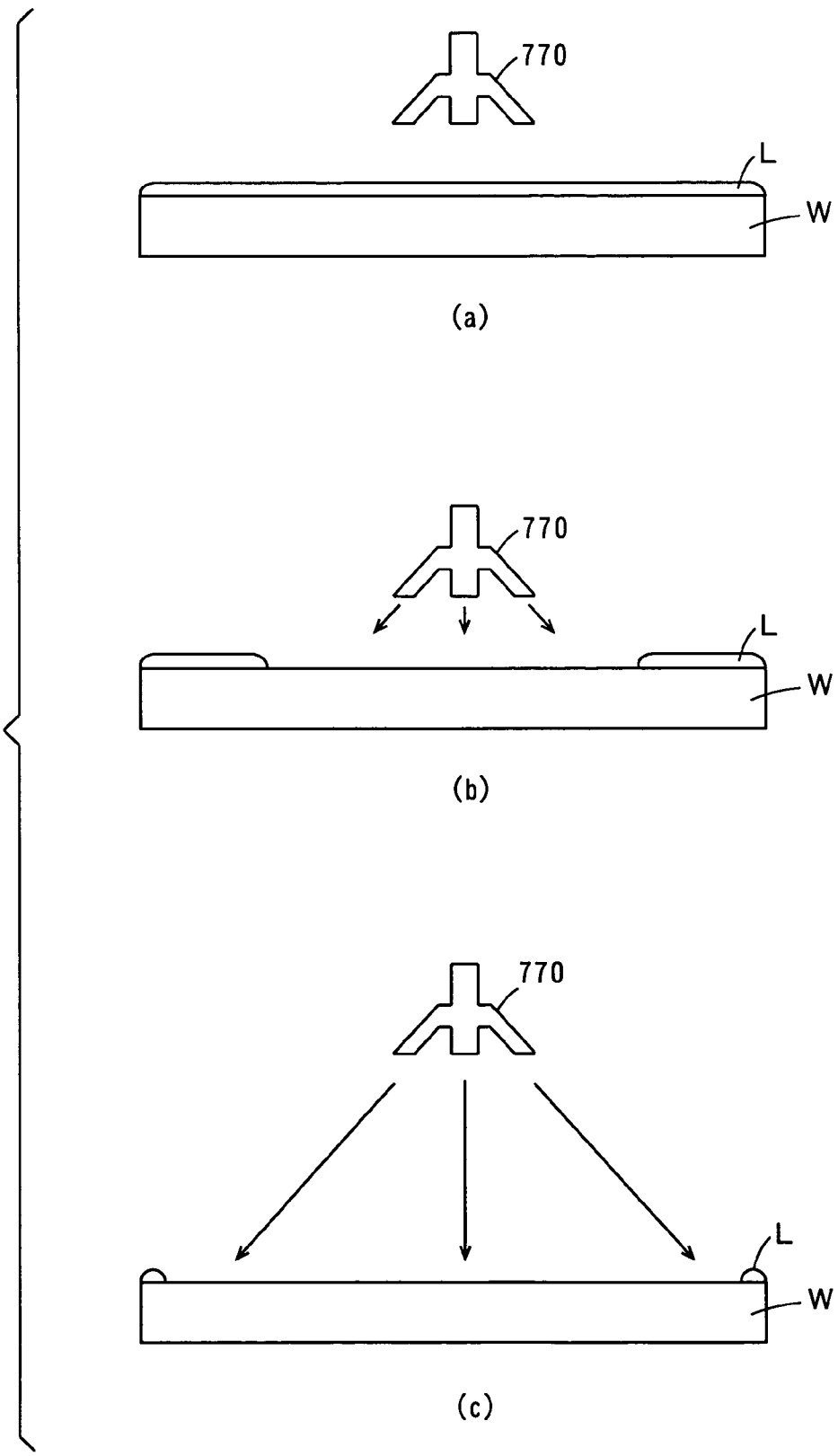
FIGS. 10(a), 10(b), and 10(c) are diagrams for use in illustrating a method of applying drying processing to a substrate using the nozzle in FIG. 9.

FIGS. 10(*a*), 10(*b*), 10(*c*) are diagrams for use in illustrating a method of applying drying processing to the substrate W using the nozzle 770.

Initially, a liquid layer L is formed on a surface of the substrate W by the method as described in FIG. 7(*a*), and then the nozzle 770 moves above the center of the substrate W, as shown in FIG. 10(*a*). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 10(*b*). At the time, the nozzle 770 is brought close to the surface of the substrate W so as to reliably move the rinse liquid present on the center of the substrate W.

Next, as the number of revolutions of the rotation shaft 625 (see FIG. 6) increases, the nozzle 770 moves upward as shown in FIG. 10(*c*). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 6.

Figure 11:
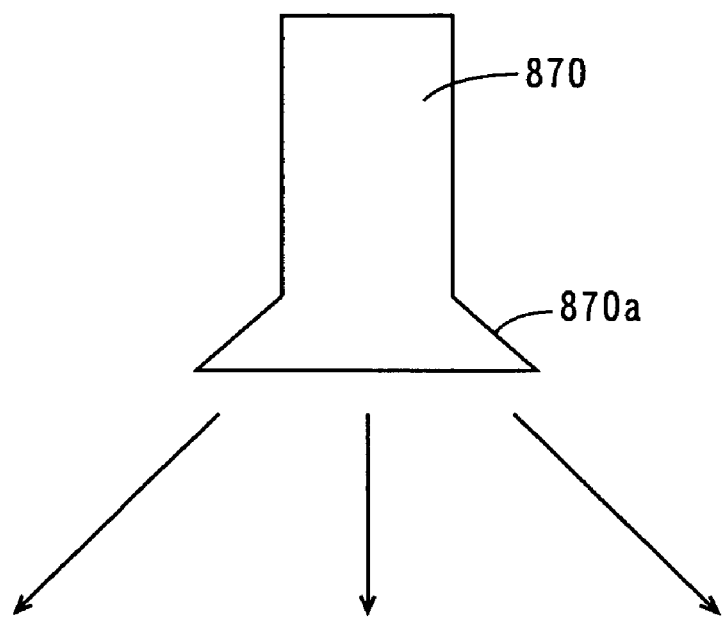
FIG. 11 is a schematic diagram showing another example of the nozzle for drying processing.

Alternatively, a nozzle 870 for drying processing as shown in FIG. 11 may be used instead of the nozzle 770. The nozzle 870 in FIG. 11 has a discharge port 870*a* whose diameter gradually increases downward. This discharge port 870*a* discharges an inert gas vertically downward and obliquely downward as indicated by the arrows in FIG. 11. That is, similarly to the nozzle 770 in FIG. 9, the nozzle 870 discharges the inert gas so as to increase the spraying area downwardly. Consequently, drying processing similar to that using the nozzle 770 can be applied to the substrate W using the nozzle 870.

A washing processing unit SOAKa as shown in FIG. 12 may also be used instead of the washing processing unit SOAK shown in FIG. 6.

The washing processing unit SOAKa in FIG. 12 is different from the washing processing unit SOAK in FIG. 6 as described below.

The washing processing unit SOAKa in FIG. 12 includes above the spin chuck 621 a disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas ($N_2$), for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

Figure 13:
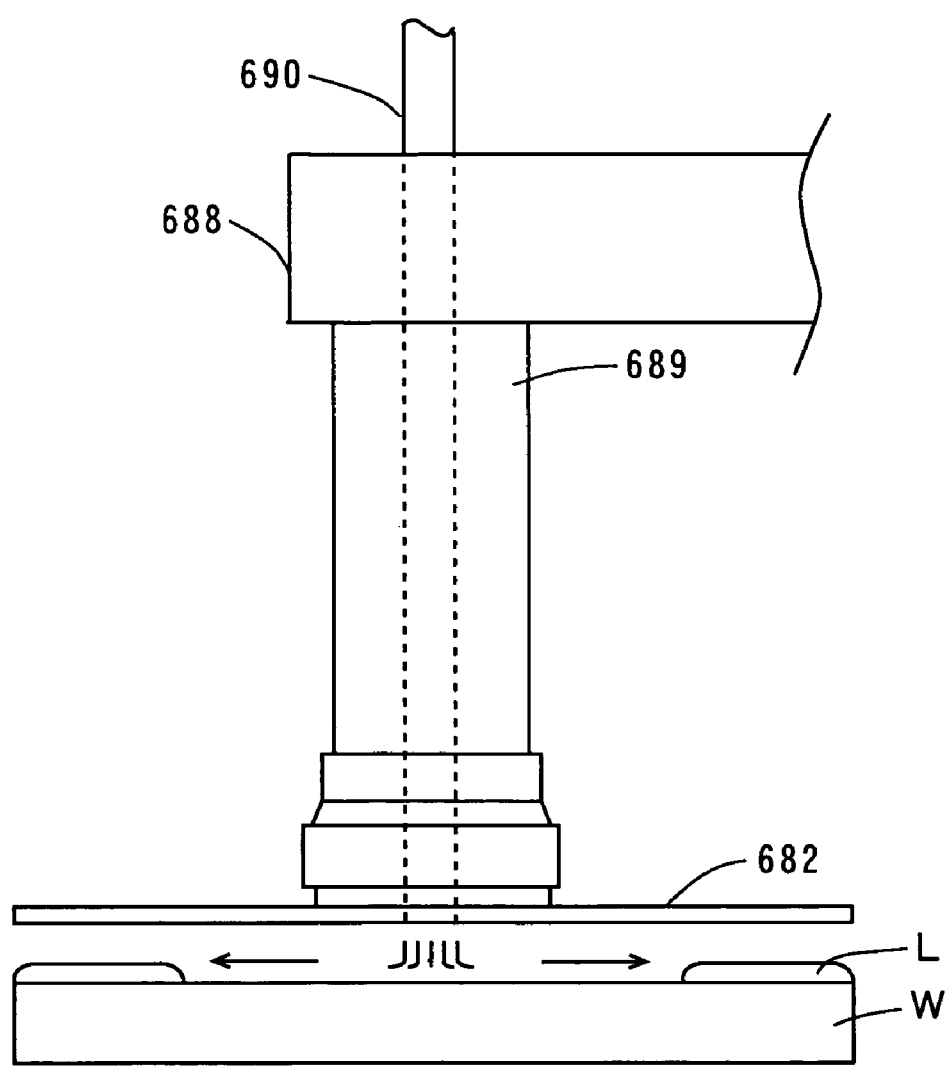
FIG. 13 is a diagram for use in illustrating a method of applying drying processing to the substrate using the washing processing unit in FIG. 12.

During the drying processing to the substrate W in the washing processing unit SOAKa in FIG. 12, with the shield plate 682 brought close to the substrate W as shown in FIG. 13, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

Although in the above-described embodiment, the substrate W is subjected to the drying processing by spin drying in the washing processing unit SOAK, the substrate W may be subjected to the drying processing by other methods such as a reduced pressure drying method or an air knife drying method.

Although in the above-described embodiment, the inert gas is supplied from the nozzle 670 with the liquid layer L of the rinse liquid being formed, the following method may be applied when the liquid layer L of the rinse liquid is not formed or the rinse liquid is not used. That is, the liquid layer of washing liquid is shaken off once by rotating the substrate W, and an inert gas is then immediately supplied from the nozzle 670 to thoroughly dry the substrate W.

In addition, as described above, it is possible to use a unit that is similar to the aforementioned washing processing units SOAK, SOAKa in configuration as the drying processing unit DRY. Note that, in the drying processing unit DRY, it is preferred that the quantity of the supply, the supply time and the like of the washing liquid and the rinse liquid are controlled in order to prevent the elution of the component of a resist on the substrate W. This prevents the deformation of the exposure pattern formed on the substrate W in the exposure device 15.

As described above, in the substrate processing apparatus 501 according to the embodiment, the substrate W is subjected to the washing processing by the washing processing unit SOAK before the exposure processing by the exposure device 15. During this washing processing, part of the component of the resist on the substrate W is eluted in the washing liquid or the rinse liquid, and washed away. Therefore, even if the substrate W is in contact with a liquid in the exposure device 15, the component of the resist on the substrate W is hardly eluted in the liquid. This prevents contamination in the exposure device 15 while preventing the component of the resist from remaining on a surface of the substrate W.

Moreover, the washing processing unit SOAK applies the drying processing to the substrate W after the washing processing by spraying the inert gas onto the substrate W from the center to the peripheral portion thereof while rotating the substrate W. This ensures that the washing liquid and the rinse liquid are removed from the substrate W, which reliably prevents the attachment of particles and the like in the atmosphere on the washed substrate W. It is thus possible to reliably prevent the contamination of the substrate W and the generation of dry marks on the surface of the substrate W.

Also, it is possible to reliably prevent the washing liquid and the rinse liquid from remaining on the washed substrate W, which reliably prevents further elution of the resist component in the washing liquid and the rinse liquid during the transport of the substrate W from the washing processing unit SOAK to the exposure device 15. It is thus possible to reliably prevent a defective shape of the resist film and the contamination inside the exposure device 15.

As a result of the foregoing, processing defects during the exposure processing in the exposure device 15 can be reduced.

Moreover, after the exposure processing by the exposure device 15, the drying processing unit DRY applies the drying processing to the substrate W by spraying the inert gas onto the substrate W from the center to the peripheral portion thereof while rotating the substrate W. This ensures that the washing liquid and the rinse liquid are removed from the substrate W, which reliably prevents the attachment of particles and the like in the atmosphere on the washed substrate W. It is thus possible to reliably prevent the contamination of the substrate W and the generation of dry marks on the surface of the substrate W.

Also, it is possible to reliably prevent the washing liquid and the rinse liquid from remaining on the washed substrate W, which reliably prevents further elution of the resist component in the washing liquid and the rinse liquid during the transport of the substrate W from the drying processing unit DRY to the development processing group 70. As a result, the accuracy of line width can be reliably prevented from decreasing during the development processing.

Further, the drying processing unit DRY applies the washing processing to the substrate W before the drying processing. Thus, even if a liquid attaches to the substrate W during exposure, and particles and the like in the atmosphere adhere to the substrate W during the transport of the substrate W from the exposure device 15 to the drying processing unit DRY, the deposits can be removed reliably.

As a result of the foregoing, processing defects of the substrate W are reliably prevented.

In addition, since the processing block 13 is arranged adjacent to the interface block 14, the substrate W can be transferred to the drying processing unit DRY immediately after the exposure processing. This prevents a liquid from dropping in the substrate processing apparatus 501 as the substrate W is carried from the drying processing unit DRY to the interface block 14, the processing block 13, the development processing block 12, the resist film processing block 11, the anti-reflection film processing block 10, and the indexer block 9. As a result, in the substrate processing apparatus 501, operational troubles such as abnormalities in the electric system are prevented.

Moreover, in this embodiment, a processing unit (the washing processing unit SOAK) that applies given processing to the substrate W before the exposure processing and a processing unit (the drying processing unit DRY) that applies given processing to the substrate W after the exposure processing can be provided in a single processing block. This reduces the footprint of the substrate processing apparatus 501.

Furthermore, in this embodiment, since the substrate processing apparatus 501 has the structure in which the processing blocks 13 is added to an existing substrate processing apparatus, processing defects that may be generated during the exposure processing and in a process after the exposure processing can be reduced at low cost.

In this embodiment, the interface transport mechanism IFR employs the hand H5 during the transport of the substrate W from the substrate platform PASS11 to the exposure device 15 and from a drying processing group 350 to the substrate platform PASS12, and employs the hand H6 during the transport of the substrate W from the exposure device 15 to the drying processing group 350. That is, the hand H6 is used in transporting the substrate W to which a liquid is attached after the exposure processing, and the hand H5 is used in transporting the substrate W to which no liquid is attached. This prevents the liquid on the substrate W from attaching to the hand H5.

Moreover, the hand H6 is provided below the hand H5, so that even if a liquid drops from the hand H6 and the substrate W held thereon, the liquid will not attach to the hand H5 and the substrate W held thereon.

As a result of the foregoing, the liquid is reliably prevented from attaching to the substrate W after the drying processing, so that operational troubles of the substrate processing apparatus 501 due to drops of liquid in the substrate processing apparatus 501 are prevented more reliably.

In addition, a liquid is prevented from attaching to the substrate W before the exposure processing and after the drying processing, which prevents the contamination of the substrate W due to the attachment of particles and the like in the atmosphere. This prevents the generation of processing defects during the exposure processing and in a process after the exposure processing more reliably.

Furthermore, the numbers of the coating units BARC, RES, the development processing units DEV, the washing processing units SOAK, the drying processing unit DRY, the heating units HP, and the cooling units CP may suitably be changed according to the processing speed of each processing block.

Third Embodiment

Figure 14:
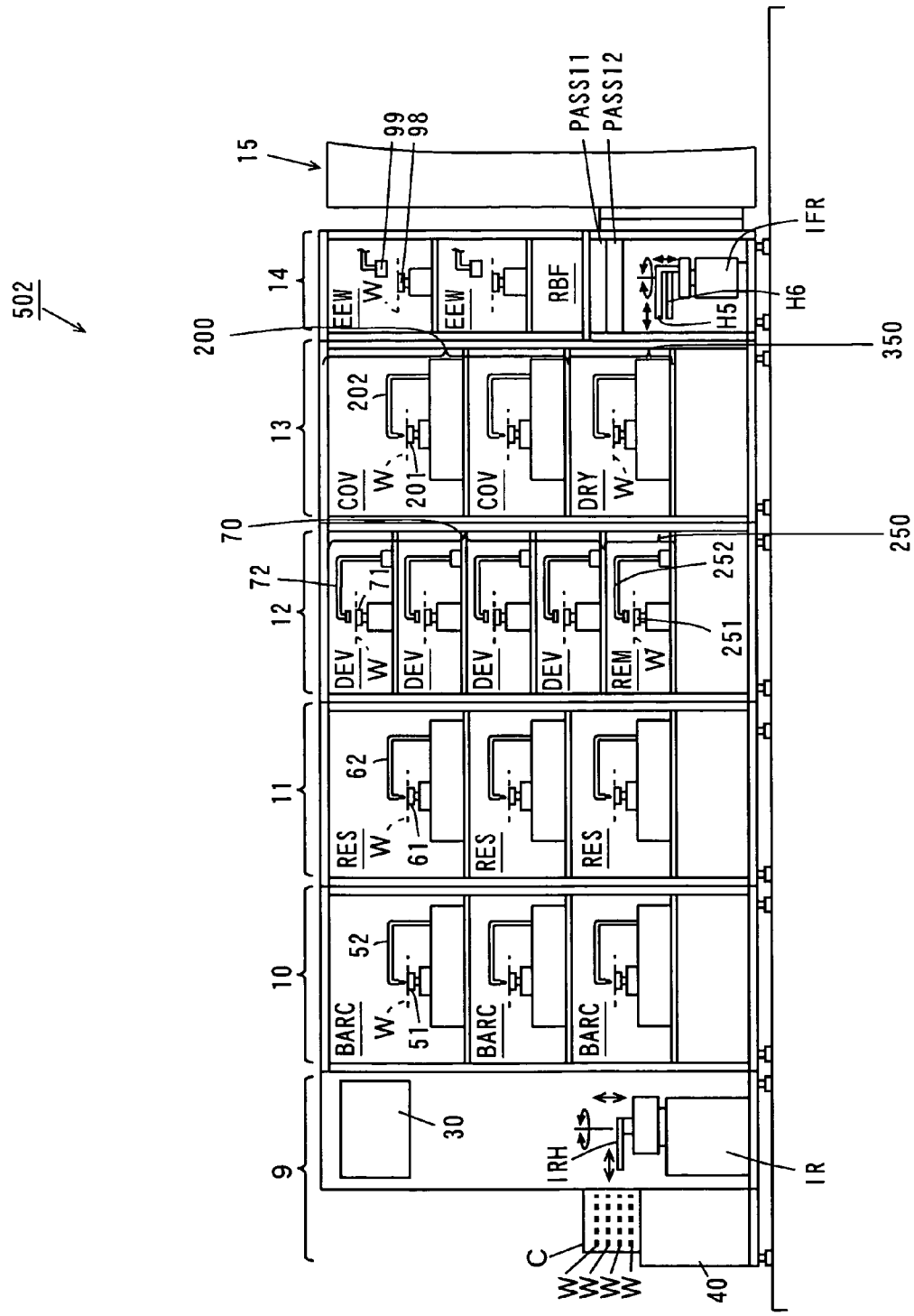
FIG. 14 is a side view of a substrate processing apparatus according to a third embodiment of the invention.

FIG. 14 is a side view of the substrate processing apparatus 502 according to a third embodiment. The substrate processing apparatus 502 shown in FIG. 14 is different from the substrate processing apparatus 500 shown in FIG. 2 in that a removal processing group 250 is provided instead of part of the development processing group 70 in the development processing block 12, and in that a drying processing group 350 is provided instead of the removal processing group 250 in the processing block 13.

The operation of the substrate processing apparatus 502 in this embodiment will be described below. Note that, the operation of the indexer block 9, the anti-reflection film processing block 10, and the resist film processing block 11 is similar to that of the first embodiment.

The substrate W that has been transferred onto the substrate platform PASS5 through the indexer block 9, the anti-reflection film processing block 10 and the resist film processing block 11 is received by the third central robot CR3 in the development processing block 12. The third central robot CR3 transfers the substrate W onto the substrate platform PASS7 (see FIG. 1).

The substrate W on the substrate platform PASS7 is received by the fourth central robot CR4 (see FIG. 1) in the processing block 13. The fourth central robot CR4 carries the substrate W to the thermal processing group 130 (see FIG. 1). Then, the fourth central robot CR4 takes out the thermally treated substrate W from the thermal processing group 130, and carries the substrate W to a coating processing group 200 in FIG. 14. The coating processing group 200 forms a coating of a resist cover film over the resist film by a coating unit COV.

After this, the fourth central robot CR4 takes out the substrate W after the coating processing from the coating processing group 200, and carries the substrate W to the thermal processing group 130 (see FIG. 1).

Then, the fourth central robot CR4 takes out the thermally treated substrate W from a thermal processing group 130, and transfers the substrate W onto the substrate platforms PASS9 (see FIG. 1). The substrate W transferred to the substrate platform PASS 9 is received by the fifth central robot CR5 (see FIG. 1) in the interface block 14. The fifth central robot CR5 carries the substrate W to an edge exposure unit EEW in FIG. 14.

After this, the fifth central robot CR5 takes out the substrate W after the edge exposure processing from the edge exposure unit EEW, and transfers the substrate W onto the substrate platform PASS11. Then, the interface transport mechanism IFR carries the substrate W from the substrate platform PASS11 to the exposure device 15 with the upper hand H5. In the exposure device 15, the substrate W is subjected to exposure processing by the liquid immersion method.

The interface transport mechanism IFR subsequently carries the substrate W after the exposure processing from exposure device 15 to the drying processing group 350 with the lower hand H6. As described above, in the drying processing group 350, the substrate W is subjected to the drying processing by the drying processing unit DRY.

Then, the interface transport mechanism IFR transfers the substrate W after the drying processing onto the substrate platform PASS12 from the drying processing group 350 with the hand H5.

The substrate W on the substrate platform PASS12 is received by the fifth central robot CR5 (see FIG. 1). The fifth central robot CR5 carries the substrate W into the thermal processing group 131 (see FIG. 1) in the processing block 13. After this, the fifth central robot CR5 takes out the thermally treated substrate W from the thermal processing group 131, and transfers the substrate W onto the substrate platform PASS10 (see FIG. 1).

The substrate W on the substrate platform PASS10 is received by the fourth central robot CR4 in the processing block 13. The fourth central robot CR4 transfers the substrate W onto the substrate platform PASS8.

The substrate W on the substrate platform PASS8 is received by the third central robot CR3 in the development processing block 12. The third central robot CR3 carries the substrate W into the removal processing group 250. As described above, the removal processing group 250 removes the resist cover film by the removal unit REM.

After this, the third central robot CR3 takes out the processed substrate W from the removal processing group 250, and carries the substrate W to the development processing group 70. Then, the third central robot CR3 takes out the substrate W after the development processing from the development processing group 70, and carries the substrate W to the thermal processing groups 120 or 121. Then, the third central robot CR3 take out the thermally treated substrate W from the thermal processing groups 120 or 121, and transfers the substrate W onto the substrate platform PASS6.

The substrate W on the substrate platform PASS6 is transferred to the carrier C through the development processing block 12, the resist film processing block 11, the anti-reflection film processing block 10, and the indexer block 9.

As described above, in the substrate processing apparatus 502 according to this embodiment, a resist cover film is formed over a resist film formed on a substrate W by the coating unit COV in the processing block 13 before the substrate W is subjected to exposure processing by the exposure device 15. Even if the substrate W is in contact with a liquid in the exposure device 15 in this case, the component of the resist is prevented from being eluted in the liquid. This prevents contamination inside the exposure device 15 while preventing the component of the resist from remaining on a surface of the substrate W. This results in reduced processing defects in substrates W during the exposure processing in the exposure device 15.

In addition, the substrate W is subjected to the drying processing by the drying processing unit DRY after the exposure processing by the exposure device 15. In this case, the liquid attached to the substrate W during the exposure processing is removed in the drying processing unit DRY. This prevents the attachment of particles and the like in the atmosphere on the substrate W after the exposure processing. As a result, the contamination of the substrate W is prevented, so that processing defects of the substrate W are reduced that may be generated in the process after the exposure processing.

Moreover, a liquid is prevented from dropping in the substrate processing apparatus 502 as the substrate W is carried from the drying processing unit DRY to the interface block 14, the processing block 13, the development processing block 12, the resist film processing block 11, the anti-reflection film processing block 10, and the indexer block 9. As a result, in the substrate processing apparatus 502, operational troubles such as abnormalities in the electric system are prevented.

Furthermore, the resist cover film is removed by the removal unit REM before the substrate W is subjected to the development processing in the development processing block 12. This ensures the removal of the resist cover film before the development processing, allowing the development processing to be reliably applied to the substrate W. This reduces the processing defects of the substrate W in the development processing unit DEV after the exposure processing.

Moreover, in this embodiment, a processing unit (the coating unit COV) that applies given processing to the substrate W before the exposure processing and a processing unit (the drying processing unit DRY) that applies given processing to the substrate W after the exposure processing can be provided in a single processing block. This reduces the footprint of the substrate processing apparatus 502.

Furthermore, in this embodiment, since the substrate processing apparatus 502 has the structure in which the processing blocks 13 is added to an existing substrate processing apparatus and the removal processing group 250 is further added in the development processing block 12, processing defects that may be generated during the exposure processing and after the exposure processing can be reduced at low cost.

In this embodiment, the interface transport mechanism IFR employs the hand H5 during the transport of the substrate W from the substrate platform PASS11 to the exposure device 15 and from a drying processing group 350 to the substrate platform PASS12, and employs the hand H6 during the transport of the substrate W from the exposure device 15 to the drying processing group 350. That is, the hand H6 is used in transporting the substrate W to which a liquid is attached after the exposure processing, and the hand H5 is used in transporting the substrate W to which no liquid is attached. This prevents the liquid on the substrate W from attaching to the hand H5.

Moreover, the hand H6 is provided below the hand H5, so that even if a liquid drops from the hand H6 and the substrate W held thereon, the liquid will not attach to the hand H5 and the substrate W held thereon.

As a result of the foregoing, the liquid is reliably prevented from attaching to the substrate W after the drying processing, so that operational troubles of the substrate processing apparatus 502 due to drops of liquid in the substrate processing apparatus 502 are prevented more reliably.

In addition, a liquid is prevented from attaching to the substrate W before the exposure processing and after the drying processing, which prevents the contamination of the substrate W due to the attachment of particles and the like in the atmosphere. This prevents the generation of processing defects during the exposure processing and after the exposure processing more reliably.

Furthermore, the numbers of the coating units BARC, RES, COV, the development processing units DEV, the removal units REM, the drying processing unit DRY, the heating units HP, and the cooling units CP may suitably be changed according to the processing speed of each processing block.

Fourth Embodiment

Figure 15:
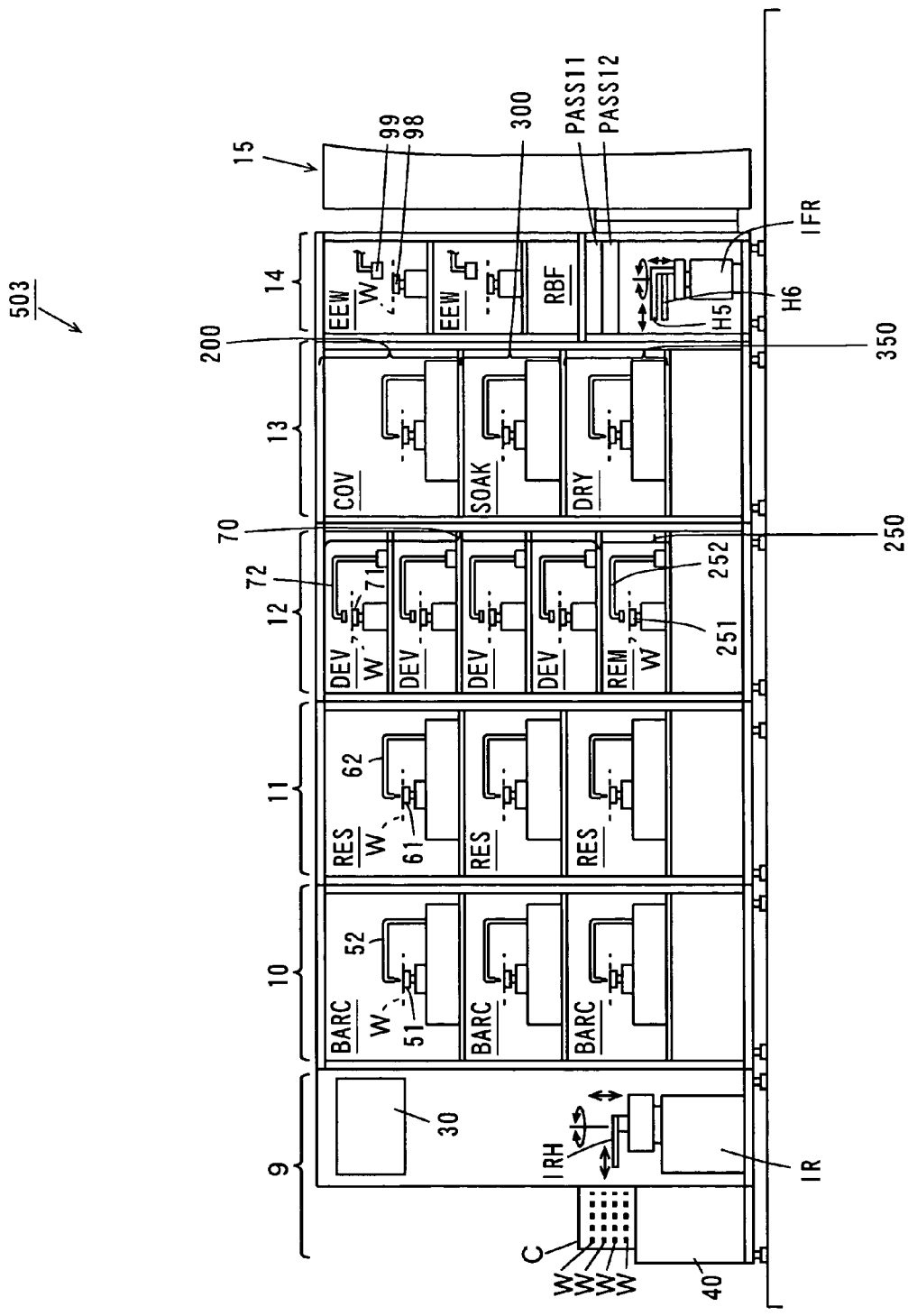
FIG. 15 is a side view of a substrate processing apparatus according to a fourth embodiment of the invention.

FIG. 15 is a side view of the substrate processing apparatus 503 according to a fourth embodiment. The substrate processing apparatus 503 shown in FIG. 15 is different from the substrate processing apparatus 502 shown in FIG. 14 in that a washing processing group 300 is provided instead of part of the coating processing group 200 in the processing block 13

The operation of the substrate processing apparatus 503 in this embodiment will be described below. Note that, the operation of the indexer block 9, the anti-reflection film processing block 10, the resist film processing block 11, and the development processing block 12 is similar to that of the third embodiment.

The substrate W that has been transferred onto the substrate platform PASS7 (see FIG. 1) through the indexer block 9, the anti-reflection film processing block 10, the resist film processing block 11, and the development processing block 12 is received by the fourth central robot CR4 (see FIG. 1) in the processing block 13. The fourth central robot CR4 carries the substrate W to the thermal processing group 130 (see FIG. 1). Then, the fourth central robot CR4 takes out the thermally treated substrate W from the thermal processing group 130, and carries the substrate W to a coating processing group 200 in FIG. 15. The coating processing group 200 forms a coating of a resist cover film over the resist film by a coating unit COV.

After this, the fourth central robot CR4 takes out the substrate W after the coating processing from the coating processing group 200, and carries the substrate W to the thermal processing group 130. Then, the fourth central robot CR4 takes out the thermally treated substrate W from a thermal processing group 130, and carries the substrate W to the washing processing group 300 in FIG. 15. In the washing processing group 300, the substrate W is subjected to the washing and drying processing by the washing processing unit SOAK. Note that, in this embodiment, the washing processing in the washing processing unit SOAK is performed for removing the particles and the like attached to the substrate W before the exposure processing, not for eluting part of the component of the resist film on the substrate W.

Then, the fourth central robot CR4 takes out the substrate W after the washing processing from the washing processing group 300, and transfers the substrate W onto the substrate platform PASS9 (see FIG. 1). The substrate W on the substrate platform PASS9 is received by the fifth central robot CR5 in the interface block 14. Then, the fifth central robot CR5 carries the substrate W to an edge exposure unit EEW in FIG. 15. The edge exposure unit EEW applies exposure processing to the peripheral portion of the substrate W.

After this, the fifth central robot CR5 takes out the substrate W after the edge exposure processing from the edge exposure unit EEW, and transfers the substrate W onto the substrate platform PASS11. Then, the interface transport mechanism IFR carries the substrate W from the substrate platform PASS11 to the exposure device 15 with the upper hand H5. In the exposure device 15, the substrate W is subjected to exposure processing by the liquid immersion method.

The interface transport mechanism IFR subsequently carries the substrate W after the exposure processing from exposure device 15 to the drying processing group 350 with the lower hand H6. As described above, in the drying processing group 350, the substrate W is subjected to the drying processing by the drying processing unit DRY.

Then, the interface transport mechanism IFR transfers the substrate W after the drying processing onto the substrate platform PASS12 from the drying processing group 350 with the hand H5.

The substrate W on the substrate platform PASS12 is received by the fifth central robot CR5 in the interface block 14. The fifth central robot CR5 carries the substrate W into the thermal processing group 131 (see FIG. 1) in the processing block 13. The substrate W is subjected to a post-exposure bake (PEB) by the thermal processing group 131. After this, the fifth central robot CR5 takes out the thermally treated substrate W from the thermal processing group 131, and transfers the substrate W onto the substrate platform PASS10 (see FIG. 1).

The substrate W on the substrate platform PASS10 is received by the fourth central robot CR4 in the processing block 13. The fourth central robot CR4 transfers the substrate W onto the substrate platform PASS8.

The substrate W on the substrate platform PASS8 is received by the third central robot CR3 in the development processing block 12. The third central robot CR3 carries the substrate W into the removal processing group 250. The removal processing group 250 removes the resist cover film by the removal unit REM.

After this, the third central robot CR3 takes out the processed substrate W from the removal processing group 250, and carries the substrate W to the development processing group 70. Then, the third central robot CR3 takes out the substrate W after the development processing from the development processing group 70, and carries the substrate W to the thermal processing group 120 or 121. Then, the third central robot CR3 takes out the thermally treated substrate W from the thermal processing group 120 or 121, and transfers the substrate W onto the substrate platform PASS6.

The substrate W on the substrate platform PASS6 is transferred to the carrier C through the development processing block 12, the resist film processing block 11, the anti-reflection film processing block 10, and the indexer block 9.

As described above, in the substrate processing apparatus 503 according to this embodiment, a resist cover film is formed over a resist film formed on a substrate W by the coating unit COV in the processing block 13 before the substrate W is subjected to exposure processing by the exposure device 15. Even if the substrate W is in contact with a liquid in the exposure device 15 in this case, the component of the resist is prevented from being eluted in the liquid. This prevents contamination inside the exposure device 15 while preventing the component of the resist from remaining on a surface of the substrate W. This results in reduced processing defects in substrates W during the exposure processing in the exposure device 15.

Moreover, the substrate W is subjected to the washing processing by the washing processing unit SOAK after the formation of the resist cover film and before the exposure processing. In this case, particles and the like attached to the substrate W are removed before the exposure processing so that contamination of the substrate W is prevented while contamination inside the exposure device 15 is prevented. Furthermore, since the substrate W is subjected to the drying processing after the washing processing in the washing unit SOAK, it is possible to prevent the attachment of particles and the like in the atmosphere to the substrate W during the transport of the substrate W to the exposure device 15 after the washing processing.

As a result of the foregoing, processing defects during the exposure processing in the exposure device 15 can be sufficiently reduced.

In addition, the substrate W is subjected to the drying processing by the drying processing unit DRY after the exposure processing by the exposure device 15. In this case, the liquid attached to the substrate W during the exposure processing is removed in the drying processing unit DRY. This reliably prevents the attachment of particles and the like in the atmosphere on the substrate W after the exposure processing. As a result, the contamination of the substrate W is prevented, so that processing defects of the substrate W are reduced that may be generated in the process after the exposure processing.

Moreover, a liquid is prevented from dropping in the substrate processing apparatus 503 as the substrate W is carried from the drying processing unit DRY to the interface block 14, the processing block 13, the development processing block 12, the resist film processing block 11, the anti-reflection film processing block 10, and the indexer block 9. As a result, in the substrate processing apparatus 503, operational troubles such as abnormalities in the electric system are prevented.

Furthermore, the resist cover film is removed by the removal unit REM before the substrate W is subjected to the development processing in the development processing block 12. This ensures the removal of the resist cover film before the development processing, allowing the development processing to be reliably applied to the substrate W. This reduces the processing defects of the substrate W in the development processing unit DEV after the exposure processing.

Moreover, in this embodiment, processing units (the coating unit COV and the washing processing unit SOAK) that applies given processing to the substrate W before the exposure processing and a processing unit (the drying processing unit DRY) that applies given processing to the substrate W after the exposure processing can be provided in a single processing block. This reduces the footprint of the substrate processing apparatus 503.

Furthermore, in this embodiment, since the substrate processing apparatus 503 has the structure in which the processing blocks 13 is added to an existing substrate processing apparatus and the removal processing group 250 is further added in the development processing block 12, processing defects that may be generated during the exposure processing and after the exposure processing can be reduced at low cost.

In this embodiment, the interface transport mechanism IFR employs the hand H5 during the transport of the substrate W from the substrate platform PASS11 to the exposure device 15 and from a drying processing group 350 to the substrate platform PASS12, and employs the hand H6 during the transport of the substrate W from the exposure device 15 to the drying processing group 350. That is, the hand H6 is used in transporting the substrate W to which a liquid is attached after the exposure processing, and the hand H5 is used in transporting the substrate W to which no liquid is attached. This prevents the liquid on the substrate W from attaching to the hand H5.

Moreover, the hand H6 is provided below the hand H5, so that even if a liquid drops from the hand H6 and the substrate W held thereon, the liquid will not attach to the hand H5 and the substrate W held thereon.

As a result of the foregoing, the liquid is reliably prevented from attaching to the substrate W after the drying processing, so that operational troubles of the substrate processing apparatus 503 due to drops of liquid in the substrate processing apparatus 503 are prevented more reliably.

In addition, a liquid is prevented from attaching to the substrate W before the exposure processing and after the drying processing, which prevents the contamination of the substrate W due to the attachment of particles and the like in the atmosphere. This prevents the generation of processing defects during the exposure processing and after the exposure processing more reliably.

Furthermore, the numbers of the coating units BARC, RES, COV, the development processing units DEV, the removal units REM, the washing units SOAK, the drying processing unit DRY, the heating units HP, and the cooling units CP may suitably be changed according to the processing speed of each processing block.

(Washing Processing Unit and Drying Processing Unit Using Two-Fluid Nozzle)

Figure 16:
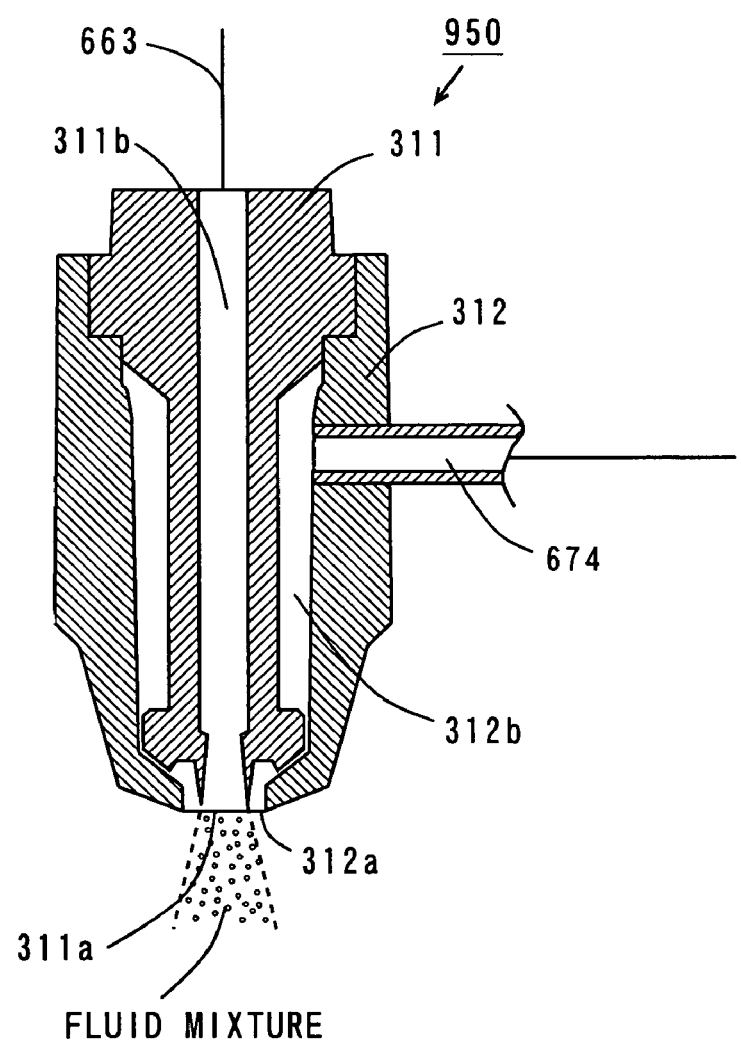
FIG. 16 is a longitudinal cross section showing an example of the internal structure of a two-fluid nozzle for use in washing and drying processing.

Although in the above-described embodiment, the nozzle 650 for cleaning processing and the nozzle 670 for drying processing in FIG. 6 are used in the washing processing unit SOAK and drying processing unit DRY, a two-fluid nozzle shown in FIG. 16 may also be used instead of one or both the nozzle 650 for washing processing and the nozzle 670 for drying processing.

FIG. 16 is a longitudinal cross section showing an example of the internal structure of the two-fluid nozzle 950 for use in washing and drying processing. The two-fluid nozzle 950 is capable of selectively discharging a gas, a liquid, and a fluid mixture of the gas and liquid.

The two-fluid nozzle 950 in this embodiment is so-called an external-mix type. The external-mix type two-fluid nozzle 950 shown in FIG. 16 comprises an inner body portion 311 and an outer body portion 312. The inner body portion 311 is composed of, e.g., quartz, and the outer body portion 312 is composed of a fluororesin such as PTFE (polytetrafluoroethylene).

A cylindrical liquid passage 311b is formed along the central axis of the inner body portion 311. The liquid passage 311b is provided with the supply pipe 663 shown in FIG. 6 for washing processing. Washing liquid or rinse liquid supplied from the supply pipe 663 is thus introduced into the liquid passage 311b.

A liquid discharge port 311a that communicates with the liquid passage 311b is formed at a lower end of the inner body portion 311. The inner body portion 311 is inserted into the outer body portion 312. Upper ends of the inner body portion 311 and the outer body portion 312 are joined together, while lower ends thereof are not joined.

A cylindrical gas passage 312b is formed between the inner body portion 311 and the outer body portion 312. A gas discharge port 312a that communicates with the gas passage 312b is formed at the lower end of the outer body portion 312. The supply pipe 674 shown in FIG. 6 for drying processing is mounted to a peripheral wall of the outer body portion 312, so as to communicate with the gas passage 312b. An inert gas supplied from the supply pipe 674 is thus introduced into the gas passage 312b.

The diameter of the gas passage 312b decreases downward in the vicinity of the gas discharge port 312a. As a result, the velocity of flow of the inert gas is accelerated, and the inert gas is discharged from the gas discharge port 312a.

The washing liquid discharged from the liquid discharge port 311a and the inert gas discharged from the gas discharge port 312a are mixed outside near the lower end of the two-fluid nozzle 950 to generate a mist-like fluid mixture that contains fine droplets of the washing liquid.

FIGS. 17(a), 17(b), 17(c) are diagrams for use in illustrating a method of applying washing and drying processing to the substrate W using the two-fluid nozzle 950 in FIG. 16.

The substrate W is initially held on the spin chuck 621 by suction, as shown in FIG. 6, and rotates together with the rotation of the rotation shaft 625. The rotation speed of the rotation shaft 625 is, e.g., about 500 rpm.

In this state, as shown in FIG. 17(a), the two-fluid nozzle 950 discharges the mist-like fluid mixture of the washing liquid and the inert gas onto the top surface of the substrate W while gradually moving from above the center of the substrate W to above the peripheral portion thereof. In this way, the fluid mixture is sprayed onto the entire surface of the substrate W from the two-fluid nozzle 950 to wash the substrate W.

Next, the supply of the fluid mixture is stopped, and the rotation speed of the rotation shaft 625 decreases while the rinse liquid is discharged from the two-fluid nozzle 950 onto the substrate W, as shown in FIG. 17(b). The rotation speed of the rotation shaft 625 is, e.g., about 10 rpm. A liquid layer L of the rinse liquid is thus formed on the entire surface of the substrate W. Alternatively, the rotation of the rotation shaft 625 may be stopped to form the liquid layer L on the entire surface of the substrate W. When pure water is used as the washing liquid in the fluid mixture for washing the substrate W, the supply of the rinse liquid may be omitted.

After the formation of the liquid layer L, the supply of the rinse liquid is stopped. Then, the inert gas is discharged onto the substrate W from the two-fluid nozzle 950, as shown in FIG. 17(c). This causes the washing liquid on the center of the substrate W to move to the peripheral portion of the substrate W, leaving the liquid layer L only on the peripheral portion.

Then, the rotation speed of the rotation shaft 625 increases. The rotation speed of the rotation shaft 625 is, e.g., about 100 rpm. This causes a great centrifugal force acting on the liquid layer L on the substrate W, allowing the removal of the liquid layer L on the substrate W. As a result, the substrate W is dried.

The two-fluid nozzle 950 may gradually move from above the center of the substrate W to above the peripheral portion thereof when removing the liquid layer L on the substrate W. This allows the inert gas to be sprayed to the entire surface of the substrate W, which ensures the removal of the liquid layer L on the substrate W. As a result, the substrate W can be reliably dried.

(Effects of Using Two-Fluid Nozzle)

In the two-fluid nozzle in FIG. 16, the fluid mixture discharged from the two-fluid nozzle 950 contains fine droplets of the washing liquid. Therefore, even if the surface of the substrate W has irregularities, any contaminants attached on the surface of the substrate W can be stripped off. The contaminants on the surface of the substrate W can thus be reliably removed. Moreover, even if the films on the substrate W have low wettability, the fine droplets of the washing liquid strip off the contaminants on the surface of the substrate W, so that the contaminants can be reliably removed from the surface of the substrate W.

As a result, when the two-fluid nozzle is used in particular in the washing processing unit SOAK, even if the solvent or the like in a resist is sublimated in the heating units HP and the sublimates are attached to the substrate W again when thermal processing is applied to the substrate W by the heating units HP before the exposure processing, the sublimates attached to the substrate W can be reliably removed by the washing processing unit SOAK. It is therefore possible to reliably prevent the contamination inside the exposure device 15.

In addition, adjusting the flow rate of the inert gas allows adjustments to be easily made to the detergency in washing the substrate W. Thus, when the organic films (i.e., a resist film or a resist cover film) on the substrate W are prone to damage, damage to the organic films on the substrate W can be prevented by weakening the detergency. Tough contaminants on the surface of the substrate W can also be removed reliably by strengthening the detergency. By adjusting the detergency in this way according to the properties of the organic films on the substrate W and the degree of contamination, it is possible to prevent damage to the organic films on the substrate W and wash the substrate W reliably.

Moreover, the external-mix type two-fluid nozzle 950 generates the fluid mixture by mixing the washing liquid and the inert gas outside the two-fluid nozzle 950. The inert gas and the washing liquid flow through the separate flow passages, respectively, in the two-fluid nozzle 950. This prevents the washing liquid from remaining in the gas passage 312b, allowing the inert gas to be discharged independently from the two-fluid nozzle 950. Also, the rinse liquid can be discharged independently from the two-fluid nozzle 950 by supplying the rinse liquid from the supply pipe 663. This allows the fluid mixture, the inert gas, and the rinse liquid to be selectively discharged from the two-fluid nozzle 950.

Furthermore, the use of the two-fluid nozzle 950 obviates the need to provide nozzles for supplying the washing liquid or the rinse liquid to the substrate W and for supplying the inert gas to the substrate W separately. This provides reliable washing and drying of the substrate W with a simple structure.

Although, in this embodiment, the two-fluid nozzle 950 is used to supply the rinse liquid to the substrate W, a separate nozzle may also be used for supplying the rinse liquid to the substrate W.

Moreover, in this embodiment, although the two-fluid nozzle 950 is used to supply the inert gas to the substrate W, a separate nozzle may also be used for supplying the inert gas to the substrate W.

(Correspondence Between Each Claim Element and Each Component in Embodiments)

In the first to forth embodiments, the anti-reflection film processing block 10, the resist film processing block 11, the development processing block 12 and the processing block 13 for liquid immersion exposure processing correspond to a processing section; the interface block 14 corresponds to an interface; the indexer block 9 corresponds to an indexer; the coating units RES correspond to a first processing unit; the resist film processing block corresponds to a first processing block; the second central robot CR2 corresponds to a first transport unit; the development processing units DEV correspond to a second processing unit; the development processing block 12 corresponds to a second processing block; the third central robot CR3 corresponds to a second transport unit; the coating units COV or the washing processing units SOAK, SOAKa correspond to a third processing unit; the removal unit REM or the drying processing units DRY correspond to a fourth processing unit; the fourth central robot CR4 corresponds to a third transport unit; the processing block 13 for liquid immersion exposure processing corresponds to a third processing block; the resist film corresponds to a photosensitive film; and the resist cover film corresponds to a protective film.

The edge exposure units EEW correspond to a fifth processing unit; the substrate platforms PASS11, 12 correspond to a platform; the fifth central robot CR5 corresponds to a fourth transport unit; the interface transport mechanism IFR corresponds to a fifth transport unit; the hand CRH9 corresponds to a first holder; the hand CRH10 corresponds to a second holder; the hand H5 corresponds to a third holder; the hand H6 corresponds to a fourth holder; the removal unit REM corresponds to a sixth processing unit; the washing processing units SOAK, SOAKa correspond to a seventh processing unit; the coating units BARC correspond to a eighth processing unit; the first central robot CR1 corresponds to a sixth transport unit; the anti-reflection film processing block 10 corresponds to a fourth processing block; and the heating units HP and the cooling units CP correspond to first to fourth thermal processing units.

The spin chuck 621 corresponds to a substrate holding device; the rotation shaft 625 and the chuck rotation-drive mechanism 636 correspond to a rotation-drive device; the nozzle 650 for washing processing corresponds to a washing liquid supplier and a rinse liquid supplier; and the nozzles 670, 770, 870 for drying processing correspond to an inert gas supplier.

The two-fluid nozzle 950 corresponds to a fluid nozzle; the liquid passage 311b corresponds to a liquid flow passage; and the gas passage 312b corresponds to a gas flow passage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus that is arranged adjacent to an exposure device that applies exposure processing to a substrate by a liquid immersion method, comprising:
   a processing section for applying processing to a substrate; and
   an interface that is provided on one end of said processing section for exchanging the substrate between said processing section and said exposure device, wherein
   said processing section comprises:
   a first processing block that includes a photosensitive film forming unit that forms a photosensitive film made of a photosensitive material on the substrate, a first thermal processing unit that thermally treats the substrate, and a first transport unit that transports the substrate;
   a second processing block that includes a development processing unit that applies development processing to the substrate after the exposure processing by said exposure device, a second thermal processing unit that thermally treats the substrate, and a second transport unit that transports the substrate;

a third processing block that includes a washing processing unit that supplies pure water onto said photosensitive film and washes the substrate after the formation of said photosensitive film by said photosensitive film forming unit and before the exposure processing by said exposure device, and a third transport unit that transports the substrate, and wherein said third processing block is arranged adjacent to said interface.

2. The substrate processing apparatus according to claim 1, wherein said interface includes:

an edge exposure processing unit that applies an edge exposure processing to the substrate;

a platform on which the substrate is temporarily mounted;

a fourth transport unit that transports the substrate between said processing section, said edge exposure processing unit, and said platform; and a fifth transport unit that transports the substrate between said platform and said exposure device.

3. The substrate processing apparatus according to claim 2, wherein said fourth transport unit includes first and second holders for holding the substrate, said fourth transport unit holds the substrate with said first holder during the transport of the substrate before the exposure processing by said exposure device, and holds the substrate with said second holder during the transport of the substrate after the exposure processing by said exposure device, said fifth transport unit includes third and fourth holders for holding the substrate, and said fifth transport unit holds the substrate with said third holder during the transport of the substrate before the exposure processing by said exposure device, and holds the substrate with said fourth holder during the transport of the substrate after the exposure processing by said exposure device.

4. The substrate processing apparatus according to claim 3 wherein said second holder is provided below said first holder, and said fourth holder is provided below said third holder.

5. The substrate processing apparatus according to claim 1, wherein said third processing block further includes a drying processing unit that dries the substrate after the exposure processing by said exposure device.

6. The substrate processing apparatus according to claim 5, wherein said drying processing unit further washes the substrate before drying the substrate.

7. The substrate processing apparatus according to claim 5, wherein said interface includes:

a substrate processing unit that applies given processing to the substrate;

a platform on which the substrate is temporarily mounted;

a fourth transport unit that transports the substrate between said processing section, said substrate processing unit, and said platform; and a fifth transport unit that transports the substrate between said platform, said exposure device and said drying processing unit.

8. The substrate processing apparatus according to claim 7, wherein said fifth transport unit includes third and fourth holders for holding the substrate, said fifth transport unit holds the substrate with said third holder during the transport of the substrate from said platform to said exposure device and from said drying processing unit to said platform, and holds the substrate with said fourth holder during the transport of the substrate from said exposure device to said drying processing unit.

9. The substrate processing apparatus according to claim 8, wherein said fourth holder is provided below said third holder.

10. The substrate processing apparatus according to claim 1, wherein said washing processing unit further dries the substrate after washing the substrate.

11. The substrate processing apparatus according to claim 1, wherein said processing section further comprises a fourth processing block that includes an anti-reflective film forming unit that forms an anti-reflecting film on the substrate before the formation of said photosensitive film by said photosensitive film forming unit, a fourth thermal processing unit that thermally treats the substrate, and a sixth transport unit that transports the substrate.

12. The substrate processing apparatus according to claim 11, further comprising an indexer that is arranged adjacent to another and of said processing section and carries in the substrate to said processing section and carries out the substrate from said processing section, wherein said fourth processing block is arranged adjacent to said indexer.

* * * * *